US012666709B2

(12) United States Patent
Chin et al.

(10) Patent No.: US 12,666,709 B2
(45) Date of Patent: Jun. 23, 2026

(54) SEMICONDUCTOR DEVICE AND METHOD

(71) Applicant: Taiwan Semiconductor Manufacturing Co., Ltd., Hsinchu (TW)

(72) Inventors: Chih-Yun Chin, Taichung (TW); Yen-Ru Lee, Hsinchu (TW); Chien-Chang Su, Kaohsiung (TW); Yan-Ting Lin, Baoshan Township (TW); Chien-Wei Lee, Kaohsiung (TW); Bang-Ting Yan, Hsinchu (TW); Heng-Wen Ting, Pingtung (TW); Chii-Horng Li, Zhubei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 439 days.

(21) Appl. No.: 17/128,656

(22) Filed: Dec. 21, 2020

(65) Prior Publication Data

US 2021/0265350 A1 Aug. 26, 2021

Related U.S. Application Data

(60) Provisional application No. 62/981,771, filed on Feb. 26, 2020.

(51) Int. Cl.
*H10D 84/85* (2025.01)
*H10D 30/01* (2025.01)
(Continued)

(52) U.S. Cl.
CPC ......... *H10D 84/853* (2025.01); *H10D 30/024* (2025.01); *H10D 30/6211* (2025.01);
(Continued)

(58) Field of Classification Search
CPC ..... H01L 21/823412; H01L 21/823418; H01L 21/823431; H01L 21/82368; H01L 21/468;
(Continued)

(56) References Cited

U.S. PATENT DOCUMENTS 7,851,865 B2 * 12/2010 Anderson ......... H01L 29/66795
257/E29.264
8,836,016 B2 * 9/2014 Wu ................... H01L 21/76224
257/E29.267
(Continued)

*Primary Examiner* — Mary A Wilczewski
(74) *Attorney, Agent, or Firm* — Slater Matsil, LLP

(57) ABSTRACT

A method includes forming first devices in a first region of a substrate, wherein each first device has a first number of fins; forming second devices in a second region of the substrate that is different from the first region, wherein each second device has a second number of fins that is different from the first number of fins; forming first recesses in the fins of the first devices, wherein the first recesses have a first depth; after forming the first recesses, forming second recesses in the fins of the second devices, wherein the second recesses have a second depth different from the first depth; growing a first epitaxial source/drain region in the first recesses; and growing a second epitaxial source/drain region in the second recess.

20 Claims, 35 Drawing Sheets

(51) Int. Cl.

| | | |
|---|---|---|
| *H10D 30/62* | (2025.01) | |
| *H10D 84/01* | (2026.01) | |
| *H10D 84/03* | (2025.01) | |

(52) U.S. Cl.
CPC ....... *H10D 84/013* (2025.01); *H10D 84/0147* (2025.01); *H10D 84/0158* (2025.01); *H10D 84/038* (2025.01)

(58) Field of Classification Search
CPC ..... H01L 21/823481; H01L 21/823814; H01L 21/823821; H01L 21/82864; H01L 27/0886; H01L 27/0924; H01L 29/41791; H01L 29/66795; H01L 29/7851; H10D 84/853; H10D 84/013; H10D 84/0128; H10D 84/0147; H10D 84/0151; H10D 84/0158; H10D 84/038; H10D 84/834; H10D 30/024; H10D 30/6211
See application file for complete search history.

(56) References Cited

U.S. PATENT DOCUMENTS

| | | | | |
|---|---|---|---|---|
| 9,136,383 | B2 * | 9/2015 | Wann | H01L 21/823807 |
| 9,543,210 | B2 * | 1/2017 | Chen | H10D 84/0135 |
| 9,882,027 | B2 * | 1/2018 | Liao | H01L 21/823418 |
| 9,899,268 | B2 * | 2/2018 | Wei | H01L 29/7851 |
| 10,026,662 | B2 * | 7/2018 | Sung | H10D 84/853 |
| 10,050,043 | B2 * | 8/2018 | Hsieh | H01L 27/0886 |
| 10,177,158 | B1 * | 1/2019 | Hsieh | H01L 29/0649 |
| 10,453,943 | B2 * | 10/2019 | Lin | H01L 27/0886 |
| 11,348,840 | B2 * | 5/2022 | Liu | H01L 21/823864 |
| 11,532,520 | B2 * | 12/2022 | More | H10D 62/116 |
| 11,581,226 | B2 * | 2/2023 | Lin | H01L 21/823821 |
| 11,581,425 | B2 * | 2/2023 | Yang | H01L 21/02057 |
| 11,600,534 | B2 * | 3/2023 | Liu | H10D 62/151 |
| 11,600,715 | B2 * | 3/2023 | Lin | H01L 29/66795 |
| 11,616,064 | B2 * | 3/2023 | Li | H01L 27/0924 |
| | | | | 257/365 |
| 11,710,663 | B2 * | 7/2023 | Keng | H01L 21/823431 |
| | | | | 257/401 |
| 11,908,862 | B2 * | 2/2024 | Li | H01L 21/823821 |
| 12,002,717 | B2 * | 6/2024 | More | H10D 84/013 |
| 12,074,071 | B2 * | 8/2024 | Liu | H10D 64/021 |
| 12,080,602 | B2 * | 9/2024 | Keng | H01L 21/823468 |
| 2011/0127610 | A1 * | 6/2011 | Lee | H01L 21/823431 |
| | | | | 257/E27.06 |
| 2011/0211338 | A1 * | 9/2011 | Schulzman | F04D 25/088 |
| | | | | 362/147 |
| 2012/0091511 | A1 * | 4/2012 | Chen | H10D 30/00 |
| | | | | 257/213 |
| 2013/0089959 | A1 * | 4/2013 | Kwok | H01L 29/7851 |
| | | | | 438/283 |
| 2013/0122676 | A1 * | 5/2013 | Jeng | H01L 21/823821 |
| | | | | 257/E21.409 |
| 2013/0230958 | A1 * | 9/2013 | Lee | H01L 21/823431 |
| | | | | 438/283 |
| 2015/0091059 | A1 * | 4/2015 | Hung | H01L 29/785 |
| | | | | 257/192 |
| 2015/0249039 | A1 * | 9/2015 | Shieh | H01L 21/823431 |
| | | | | 438/702 |
| 2015/0380315 | A1 * | 12/2015 | Chen | H10D 84/0135 |
| | | | | 438/283 |
| 2016/0315146 | A1 * | 10/2016 | Jung | H01L 29/7848 |
| 2017/0098648 | A1 * | 4/2017 | Lee | H10D 84/038 |
| 2017/0133286 | A1 * | 5/2017 | Sung | H10D 62/151 |
| 2017/0221907 | A1 * | 8/2017 | Hsieh | H10B 10/12 |
| 2017/0309624 | A1 * | 10/2017 | Cheng | H01L 29/167 |
| 2018/0151703 | A1 * | 5/2018 | Lin | H01L 29/161 |
| 2018/0374858 | A1 * | 12/2018 | Hsieh | H01L 29/0649 |
| 2019/0035923 | A1 * | 1/2019 | Sadana | H01L 29/78696 |
| 2019/0035925 | A1 * | 1/2019 | Li | H01L 23/5329 |
| 2019/0148528 | A1 * | 5/2019 | Yu | H01L 29/42384 |
| | | | | 257/288 |
| 2019/0393096 | A1 * | 12/2019 | Tang | H10D 84/834 |
| 2020/0152461 | A1 * | 5/2020 | Kim | H01L 21/823431 |
| 2021/0265350 | A1 * | 8/2021 | Chin | H01L 27/0924 |
| 2021/0343596 | A1 * | 11/2021 | Yang | H01L 21/823412 |
| 2022/0051945 | A1 * | 2/2022 | More | H01L 21/76224 |
| 2022/0246611 | A1 * | 8/2022 | Tang | H01L 21/823468 |

* cited by examiner

SEMICONDUCTOR DEVICE AND METHOD

PRIORITY CLAIM AND CROSS-REFERENCE

This application claims the benefit of U.S. Provisional Application No. 62/981,771, filed on Feb. 26, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
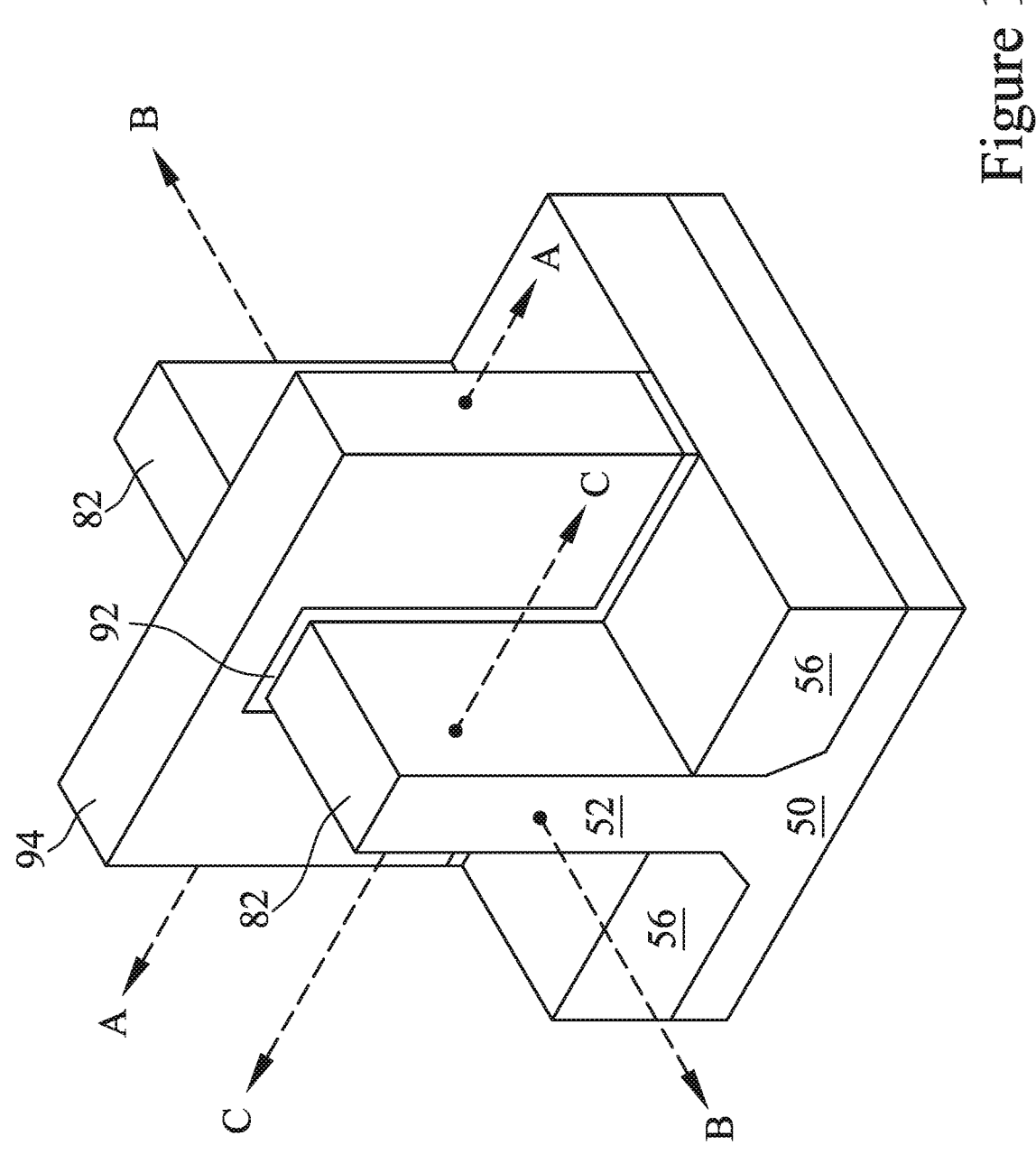
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, source/drain recesses are formed in fins (e.g., semiconductor strips) using a multi-cycle (m-cycle) etch. Specifically, different etching processes are used in different regions of a substrate to form source/drain recesses of different depths in the different regions. In some embodiments, each region may include devices having different numbers of fins. For example, one region may include single-fin devices, another region may include double-fin devices, and another region may include triple-fin devices. The recesses may be formed using photolithography and etching processes (e.g., cycles), with one cycle performed for each region. The cycles may be performed in any order, and in different regions of a substrate. In some embodiments, the photolithography and etching processes are used to form the source/drain recesses of the different regions at different depths. For example, the depth of the recesses of one region may be different from the depth of the recesses of another region. In some embodiments, regions corresponding to devices having larger numbers of fins may be formed having deeper recesses than region corresponding to devices having smaller numbers of fins (including single-fin devices). In some embodiments, the photolithography and etching processes are used to form source/drain recesses of successively increasing depths. A deeper recess may allow for the formation of a larger epitaxial source/drain region, and thus the techniques herein allow for the formation of different types of devices or fin structures having different epitaxial source/drain volumes, which can improve the operation (e.g., current) of the devices and improve performance.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 23B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 11A, 18A, 19A, 20A, 21A, 22A, and 23A are illustrated along reference cross-section A-A illustrated in FIG. 1, and FIGS. 8B, 11B, 13, 15, 16, 18B, 19B, 20C, 21B, 22B, and 23B are illustrated along a similar cross-section B-B illustrated in FIG. 1, except for multiple fins/FinFETs. FIGS. 12, 14, 16, 18C, and 18D are illustrated along reference cross-section C-C illustrated in FIG. 1, except for multiple fins/FinFETs.

Figure 2:
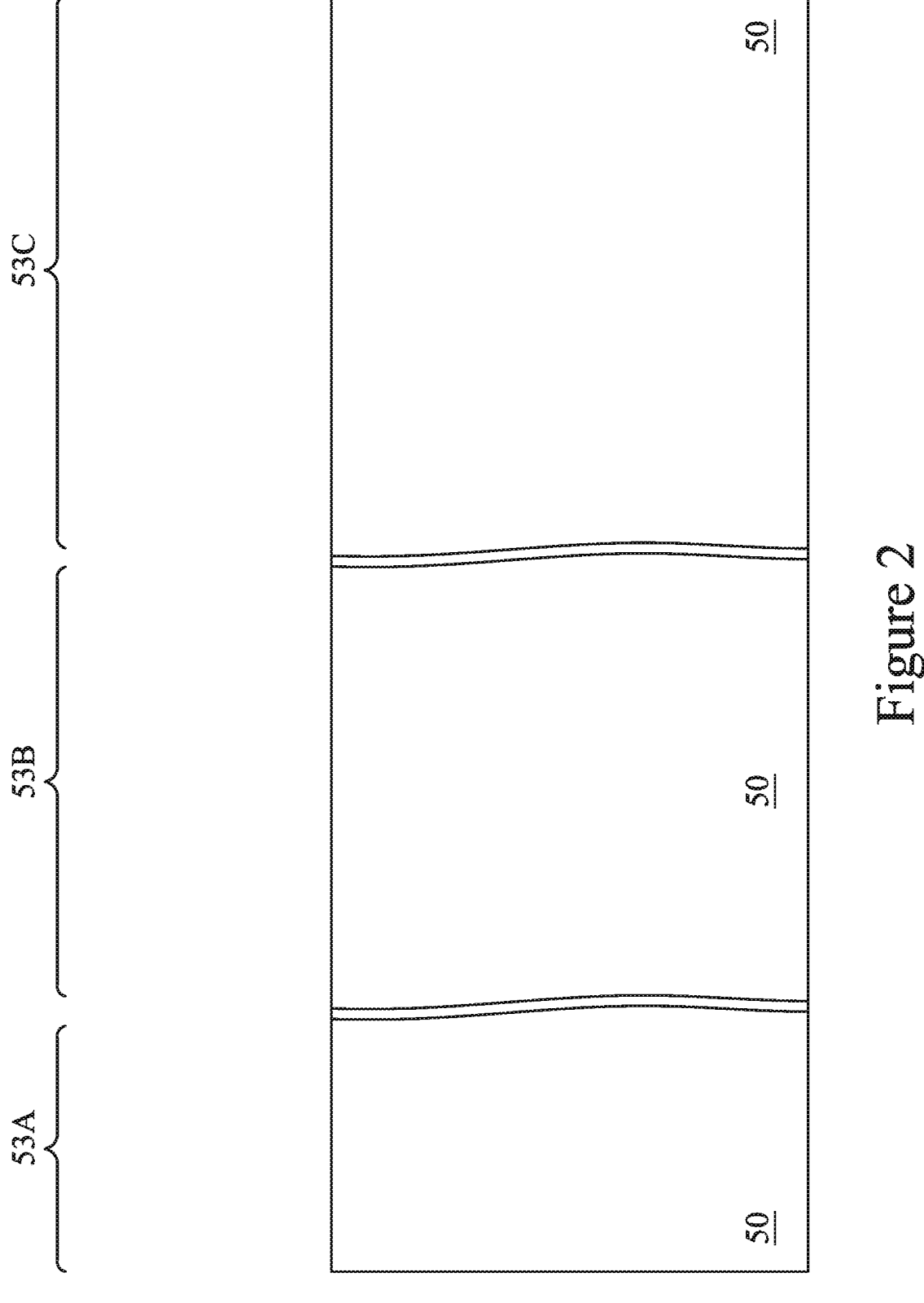
FIGS. 2, 3, 4, 5, 6, 7, 8A, and 8B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 shows the substrate 50 divided into regions 53 representing regions of the substrate 50 in which FinFET structures having different numbers of fins 52 (see FIG. 3) are formed. For example, region 53A may include regions of the substrate 50 in which single-fin structures are formed, region 53B may include regions of the substrate 50 in which double-fin structures are formed, and region 53C may include regions of the substrate 50 in which structures having three fins are formed. Examples of single-fin structures include FinFETs, SRAM structures, process control monitoring (PCM) logic structures, other circuits, or the like. Examples of double-fin structures include FinFET structures, ring oscillator (RO) structures, PCM logic structures, other circuits, or the like. Examples of multi-fin structures having three or more fins include FinFET structures, electrostatic discharge (ESD) protection structures, PIO structures, PCM logic structures, other circuits, or the like. These are examples, and these structures may be formed having other numbers of fins than described, or other structures than these examples may be formed.

In other embodiments, more or fewer regions 53 may be present, and/or the regions 53A-C may correspond to different numbers of fins 52 than shown. For example, in other embodiments, a region 53 may include regions of the substrate 50 in which multi-fin structures having four, five, or another number of fins 52 are formed. Additionally, a region 53 may include regions of the substrate 50 corresponding to a range of the number of fins 52. As examples, a region 53 may include regions of the substrate 50 in which structures having three fins 52 or four fins 52 are formed, or a region 53 may include regions of the substrate 50 in which structures having three or more fins 52 are formed. These are examples, and more or fewer regions 53 may be used than described herein, or the regions 53 may correspond to different numbers of fins 52 than described herein. In some embodiments, two or more regions 53 may include multi-fin structures having the same number of fins 52.

Some regions 53 may be physically separated from other regions 53 (as illustrated by dividers in FIG. 2), and any number of device features (e.g., other active devices, doped regions, isolation structures, etc.) may be disposed between the regions 53. The regions 53 may include n-type regions, p-type regions, or a combination of n-type and p-type regions. The n-type regions can be for forming n-type devices, such as NMOS transistors, e.g., n-type FinFETs, the p-type regions can be for forming p-type devices, such as PMOS transistors, e.g., p-type FinFETs.

Figure 3:
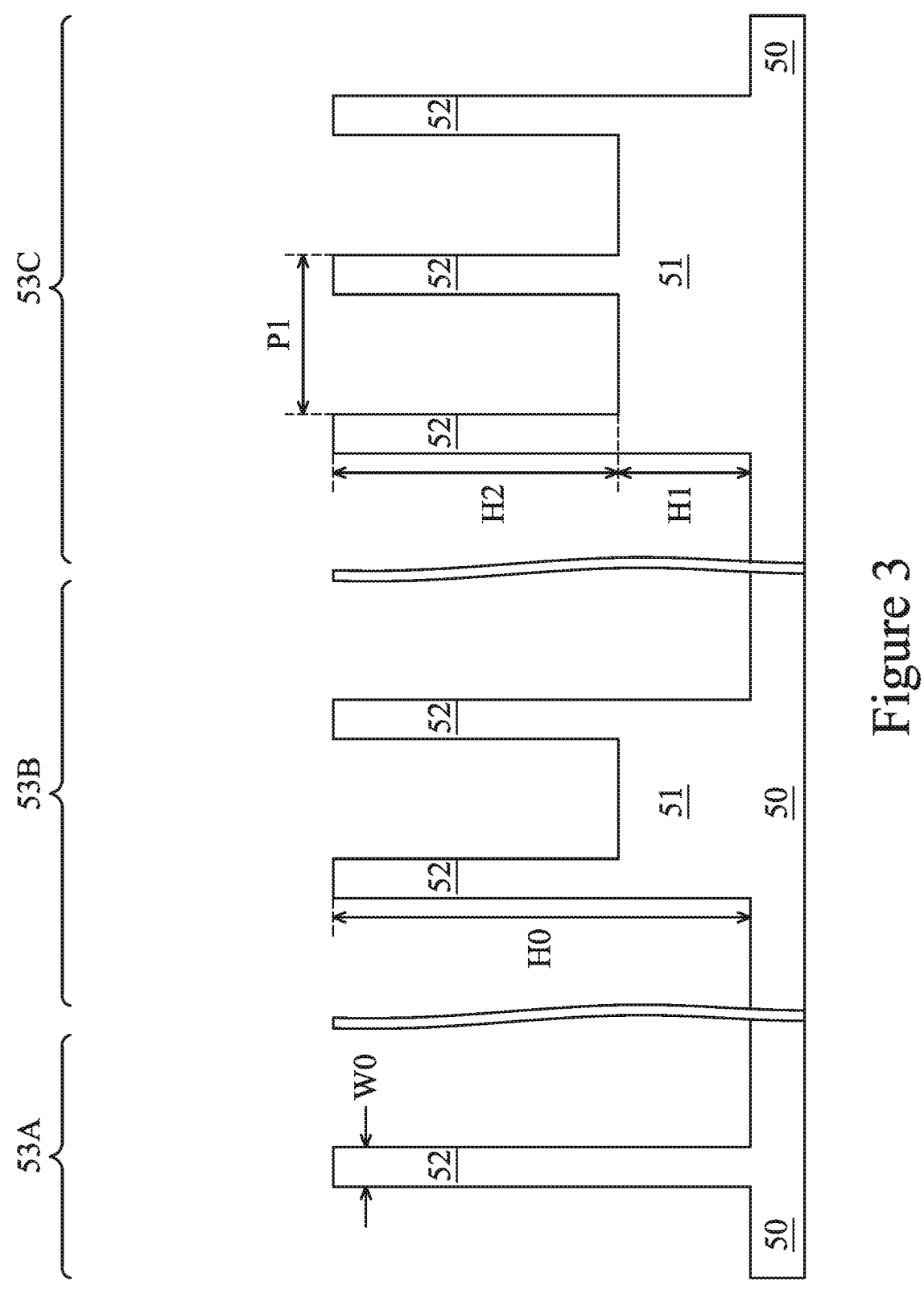

In FIG. 3, fins 52 are formed in the substrate 50. The fins 52 are semiconductor strips. As shown in FIG. 3, region 53A includes a single-fin structure, region 53B includes a double-fin structure, and region 53C includes a triple-fin structure. In some embodiments, the fin(s) 52 in each region 53 may be formed in a multi-fin "crown structure" in which multiple fins 52 protrude from a base 51, which itself protrudes from the substrate 50. For example, the region 53B shown in FIG. 3 includes a multi-fin structure with two fins 52 formed on a single base 51, and the region 53C includes a multi-fin structure with three fins 52 formed on a single base 51. In some embodiments, the bases 51 and/or fins 52 may be formed in the substrate 50 by etching trenches in the substrate 50. In some embodiments, a crown structure may be formed by first forming a patterned hard mask (not shown) over the substrate 50 and etching the substrate 50 using the patterned hard mask to form a patterned substrate (not shown). The pattern of the patterned substrate corresponds to regions where bases 51 and/or fins 52 are subsequently formed. Then, another patterned hard mask (not shown) may be formed over the patterned substrate and used to etch the patterned substrate to form the fins 52. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52. In other embodiments, bases 51 are not formed.

In some embodiments, the fins 52 may be formed having a height H0 above the substrate 50 that is in a range between about 50 nm and about 170 nm. The bases 51 may be formed having a height H1 above the substrate 50 that is in a range between about 30 nm and about 90 nm. The fins 52 may be formed protruding above a base 51 a height H2 that is in a range between about 30 nm and about 80 nm. In some embodiments, the fins 52 have a width W0 that is in a range between about 3 nm and about 20 nm. In some embodiments, the fins 52 of a multi-fin structure may be formed having a pitch P1 that is in a range between about 15 nm and about 50 nm. Other heights, widths, pitches, or combinations thereof are possible.

Figure 4:
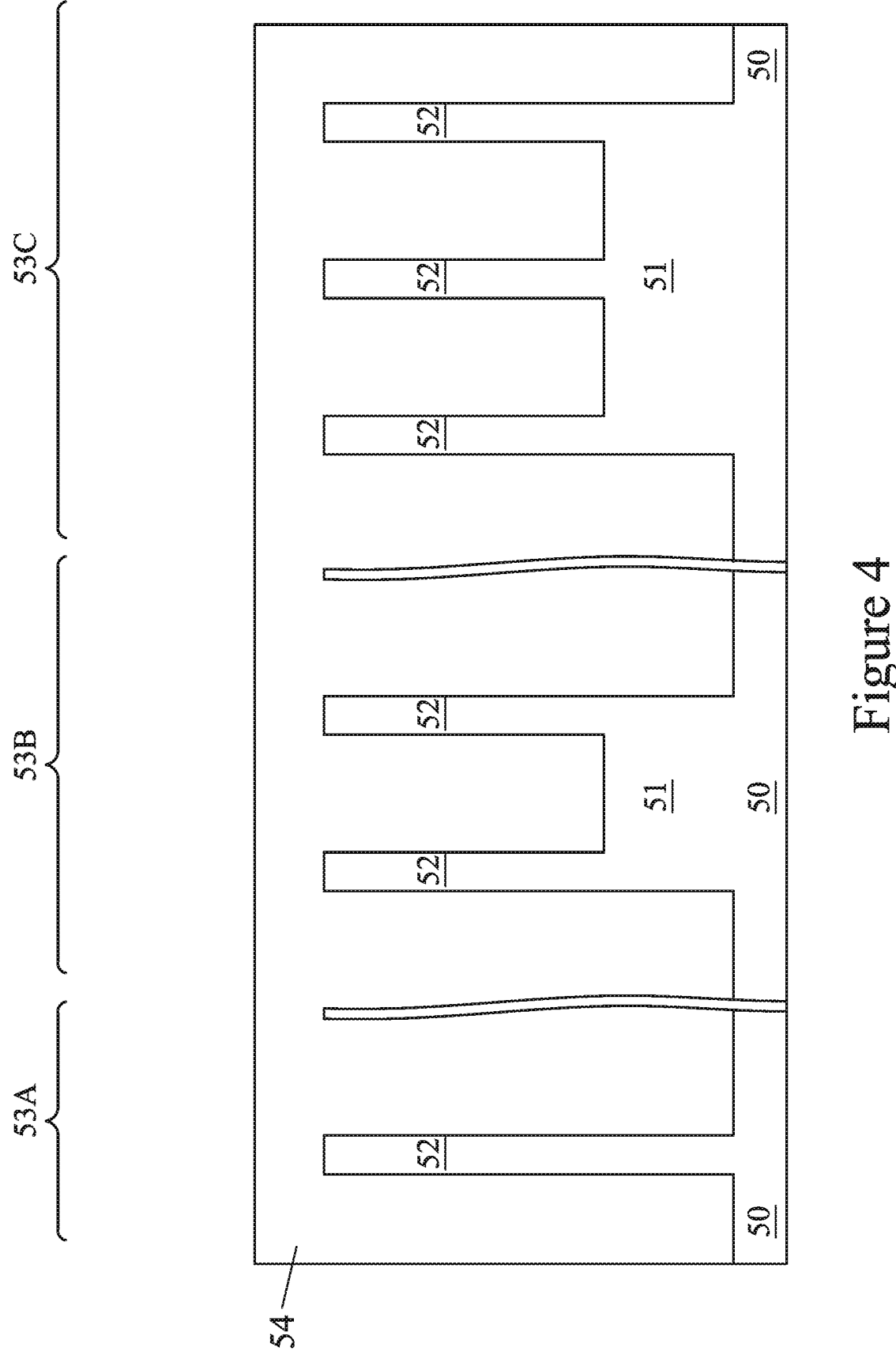

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above, may be formed over the liner.

Figure 5:
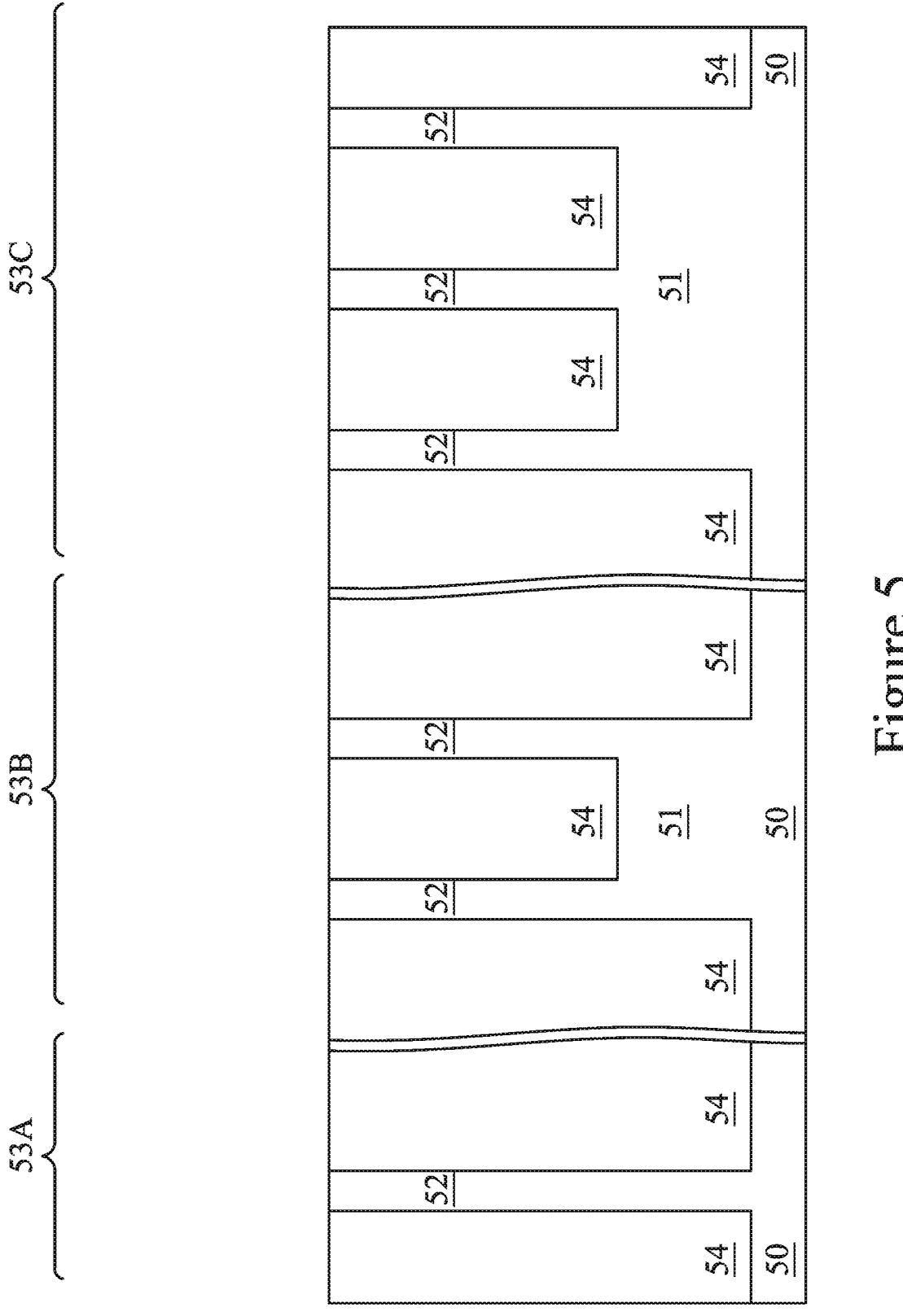

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
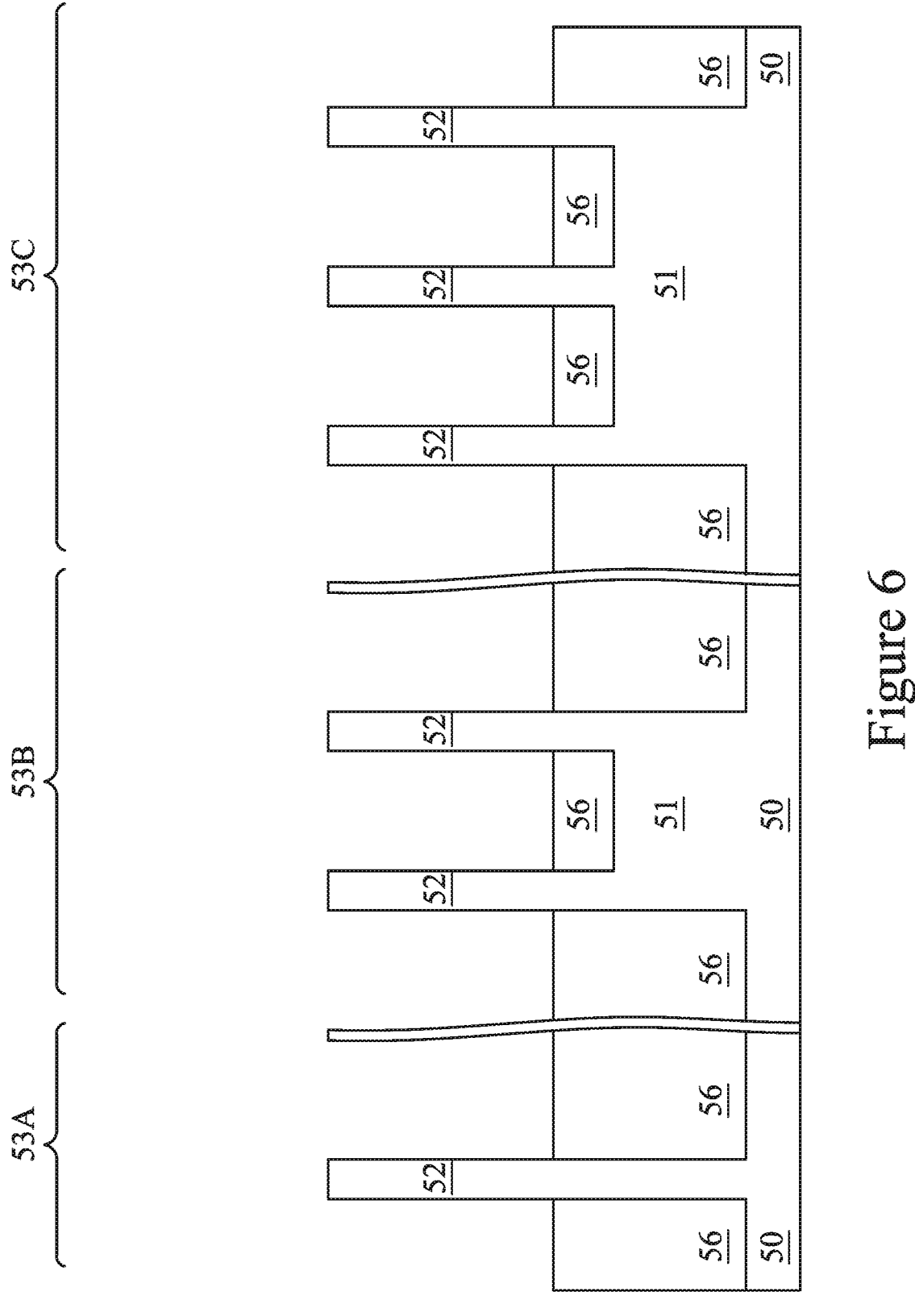

In FIG. 6, the insulation material 54 is recessed to form Shallow Trench Isolation (STI) regions 56. The insulation material 54 is recessed such that upper portions of fins 52 protrude from between neighboring STI regions 56. The portions of the bases 51 between fins 52 may remain covered, as shown in FIG. 6. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in an n-type region (e.g., an NMOS region) different from the material in a p-type region (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in an n-type region, and an N well may be formed in a p-type region. In some embodiments, a P well or an N well are formed in both an n-type region and a p-type region.

In the embodiments with different well types, the different implant steps for an n-type region and a p-type region may be achieved using a photoresist and/or other masks (not shown). For example, a photoresist may be formed over the fins 52 and the STI regions 56 in the n-type region. The photoresist is patterned to expose the p-type region of the substrate 50. The photoresist can be formed by using a spin-on technique and can be patterned using acceptable photolithography techniques. Once the photoresist is patterned, an n-type impurity implant is performed in the p-type region, and the photoresist may act as a mask to substantially prevent n-type impurities from being implanted into the n-type region. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region, a photoresist is formed over the fins 52 and the STI regions 56 in the p-type region. The photoresist is patterned to expose the n-type region of the substrate 50. The photoresist can be formed by using a spin-on technique and can be patterned using acceptable photolithography techniques. Once the photoresist is patterned, a p-type impurity implant may be performed in the n-type region, and the photoresist may act as a mask to substantially prevent p-type impurities from being implanted into the p-type region. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region and the p-type region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
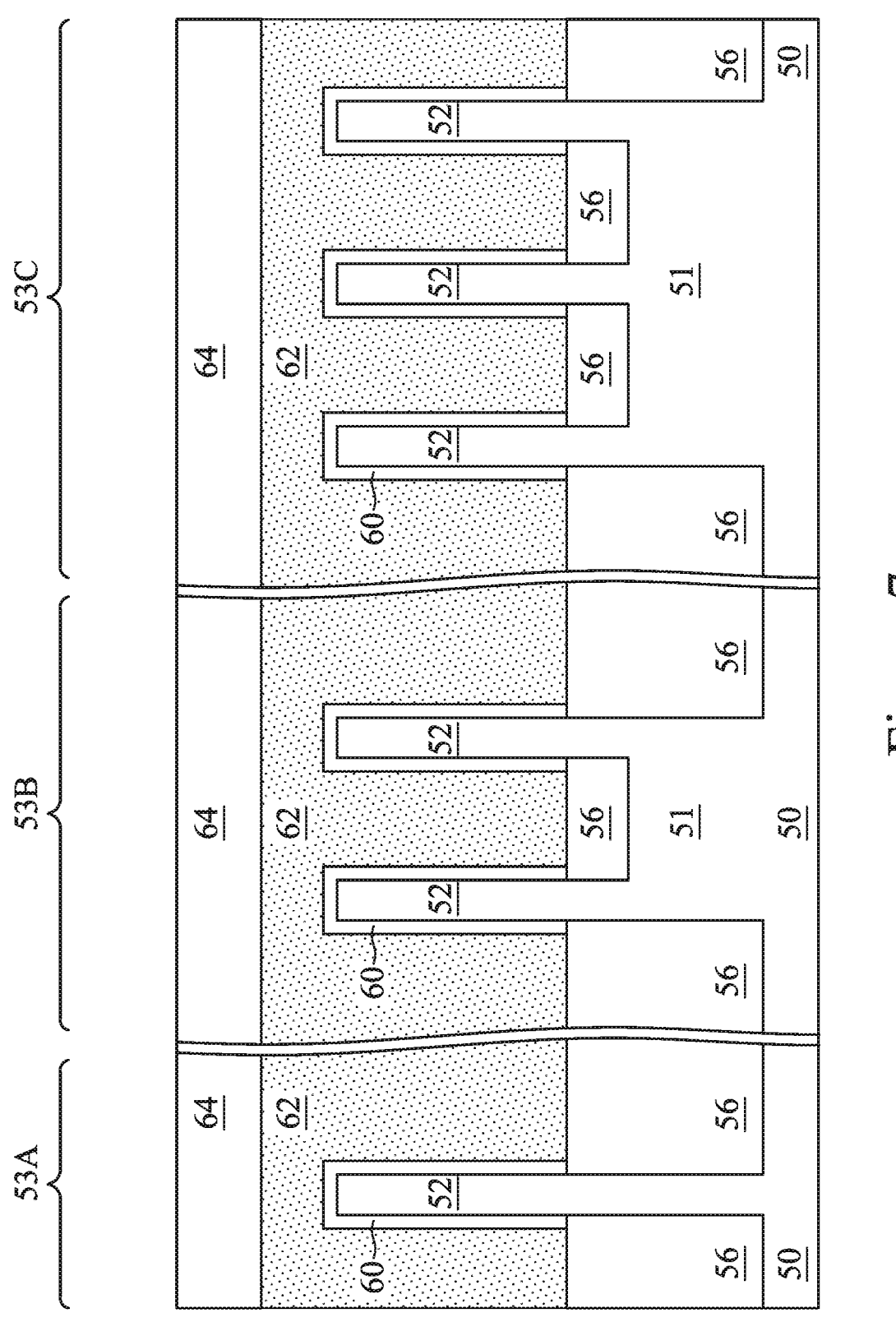

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

Figure 8A:
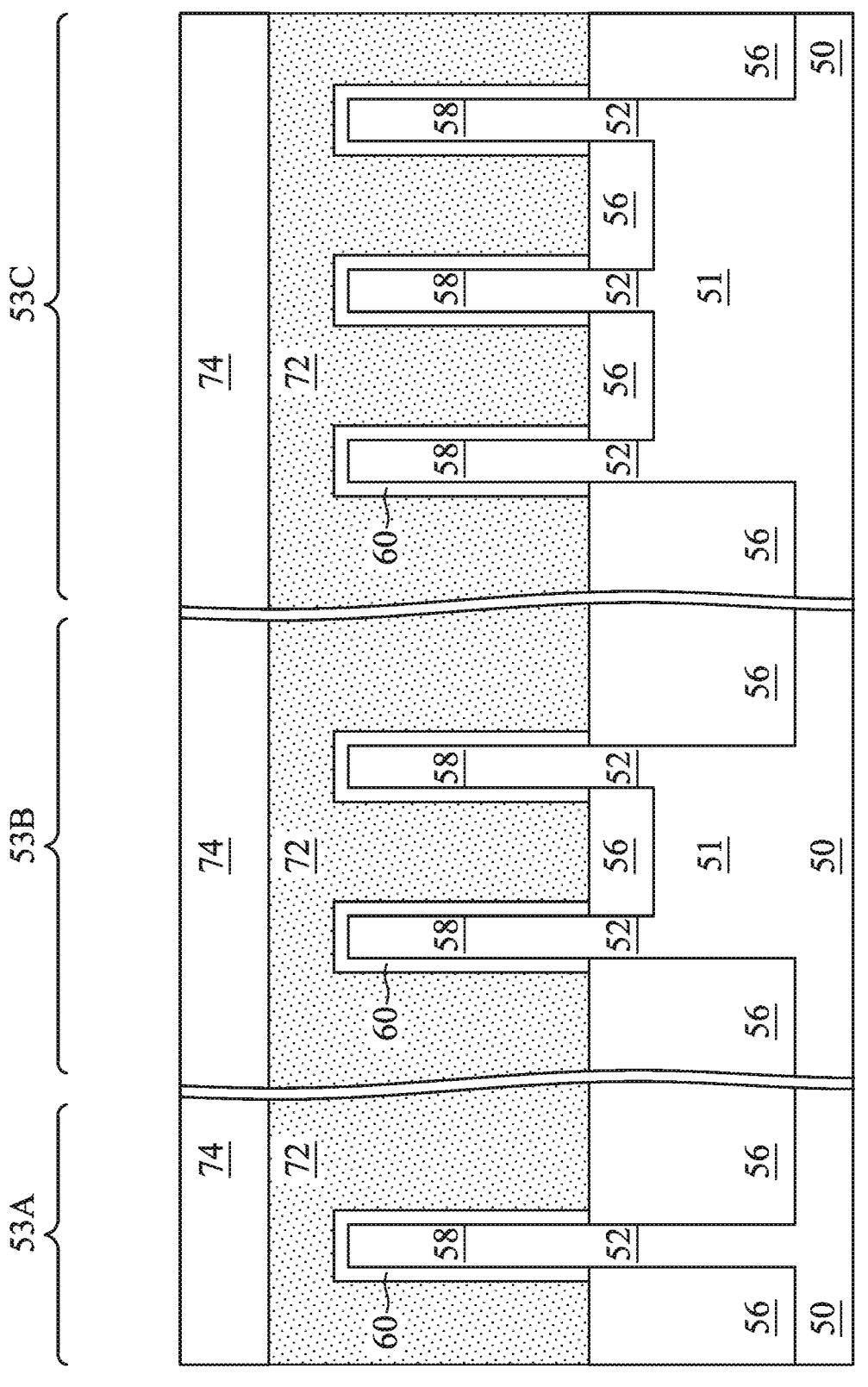
Figure 8B:
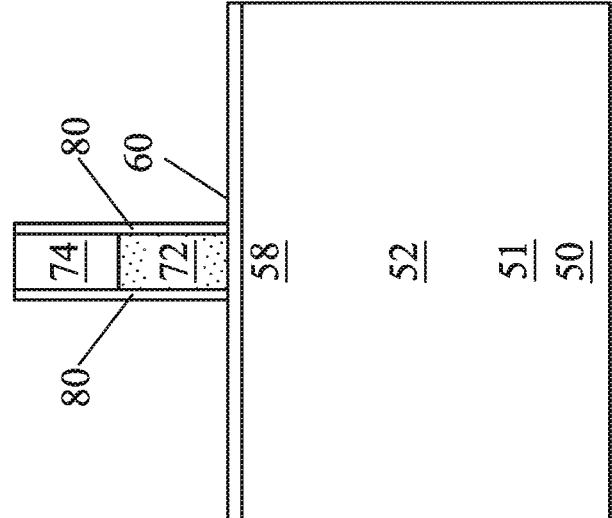

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over an n-type region, while exposing a p-type region, and appropriate type (e.g., p-type) impurities may be implanted into the exposed fins 52 in the p-type region. The mask may then be removed. Subsequently, a mask, such as a photoresist, may be formed over the p-type region while exposing the n-type region, and appropriate type impurities (e.g., n-type) may be implanted into the exposed fins 52 in the n-type region. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9:
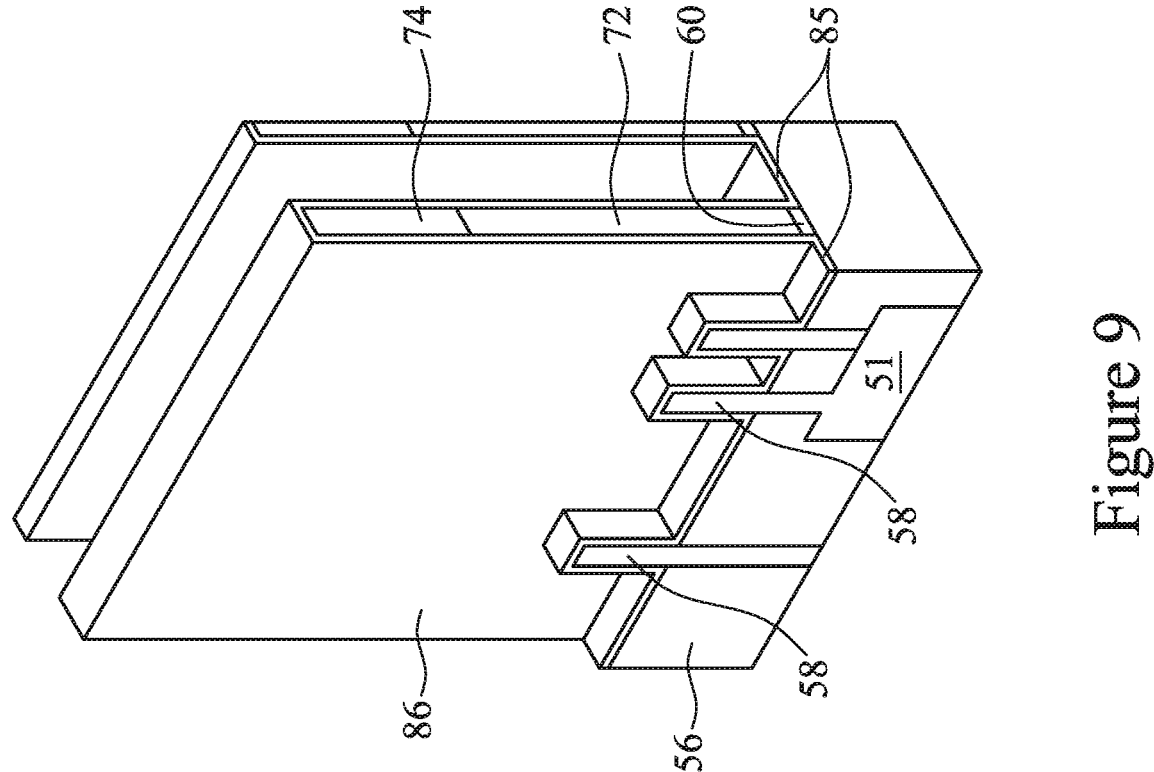
FIGS. 9 and 10 are three-dimensional views of intermediate stages in the manufacturing of FinFETs, in accordance with some embodiments.
Figure 10:
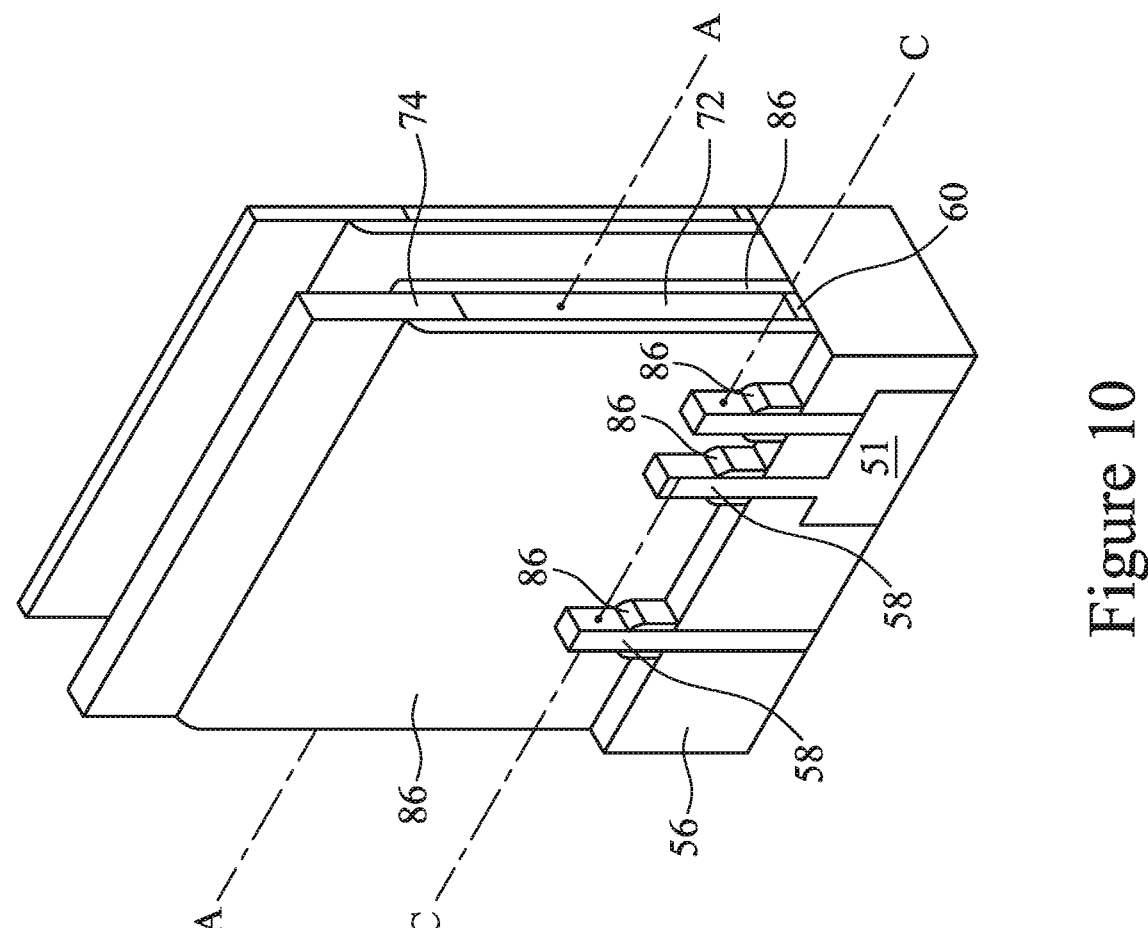

In FIGS. 9 and 10, gate spacers 86 are formed along sidewalls of the dummy gates 72 and the masks 74. FIGS. 9 and 10 illustrate a perspective view of a structure similar to that shown in FIGS. 8A-B except that FIGS. 9 and 10 show a single-fin region (e.g., region 53A) adjacent to a double-fin region (e.g., region 53B). For clarity, the gate seal spacers 80 are not shown in FIGS. 9-10. In FIG. 9, a spacer layer 83 is conformally deposited over the structure. The spacer layer 83 may be, for example, silicon oxide, silicon nitride, silicon oxynitride, silicon carbonitride, a combination thereof, or the like. In some embodiments, the spacer layer 83 comprises multiple layers.

In FIG. 10, an anisotropic etching process is performed to remove the horizontal portions of spacer layer 83. The remaining vertical portions of spacer layer 83 form gate spacers 86 on the sidewalls of the dummy gates 72 and masks 74 and on the sidewalls of fins 52. In some embodiments, portions of the spacer layer 83 remain on top surfaces of the fins 52 or remain on the STI regions 56 after performing the anisotropic etching process.

Figure 11A:
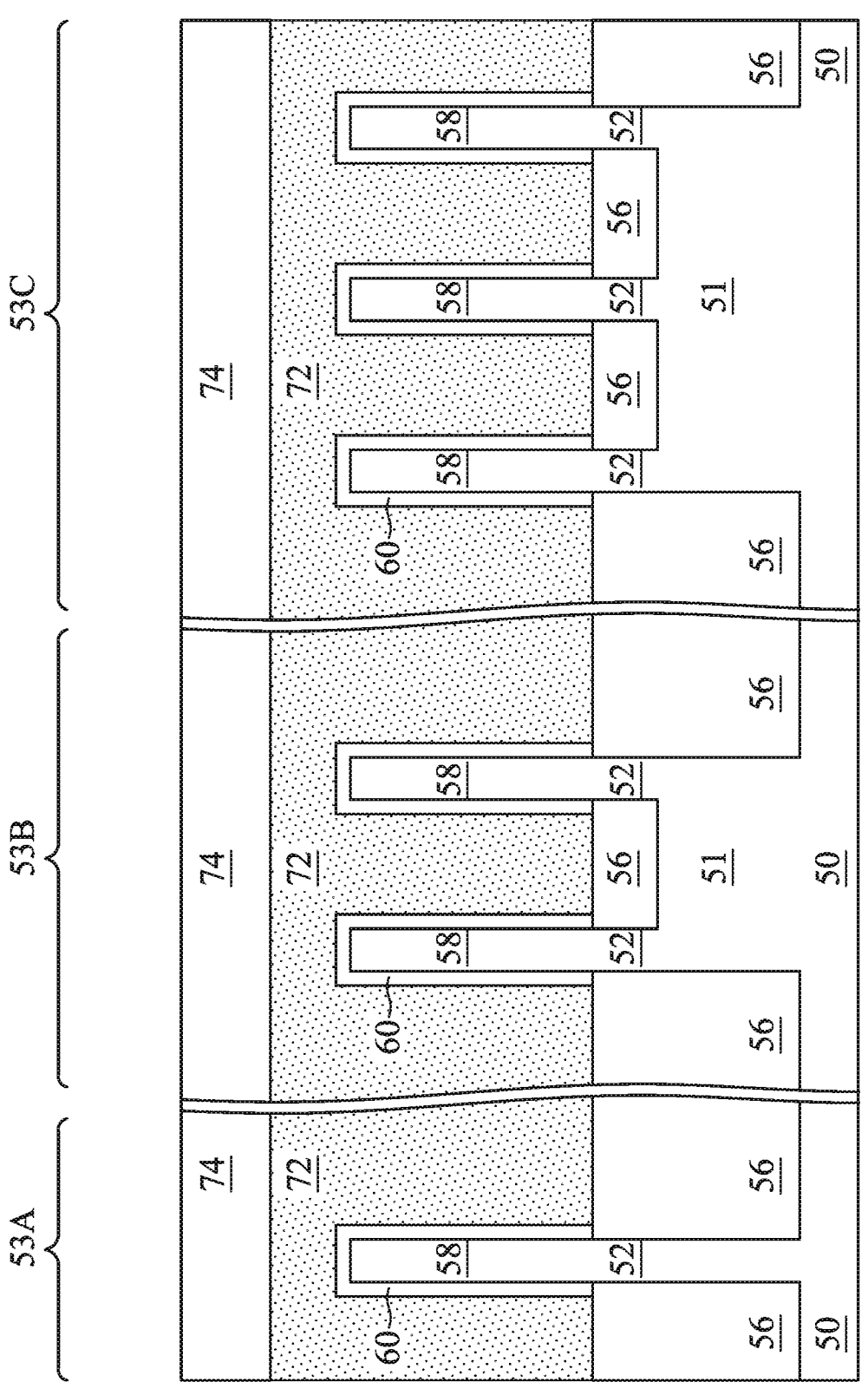
FIGS. 11A, 11B, and 11C are cross-sectional views of intermediate stages in the manufacturing of FinFETs, in accordance with some embodiments.
Figure 11B:
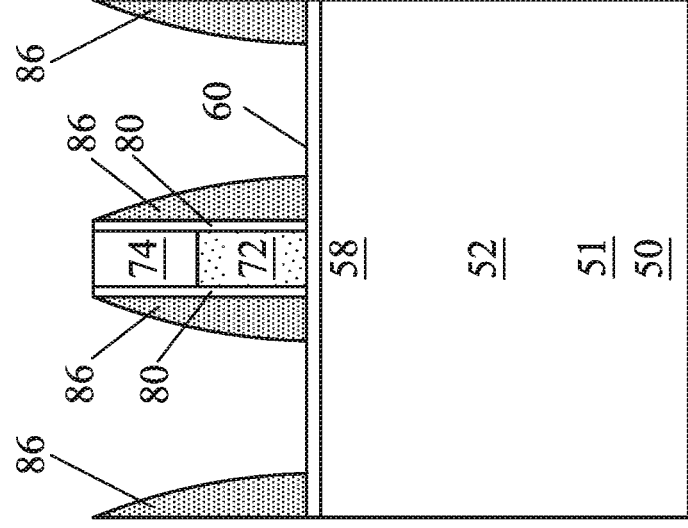
Figure 11C:
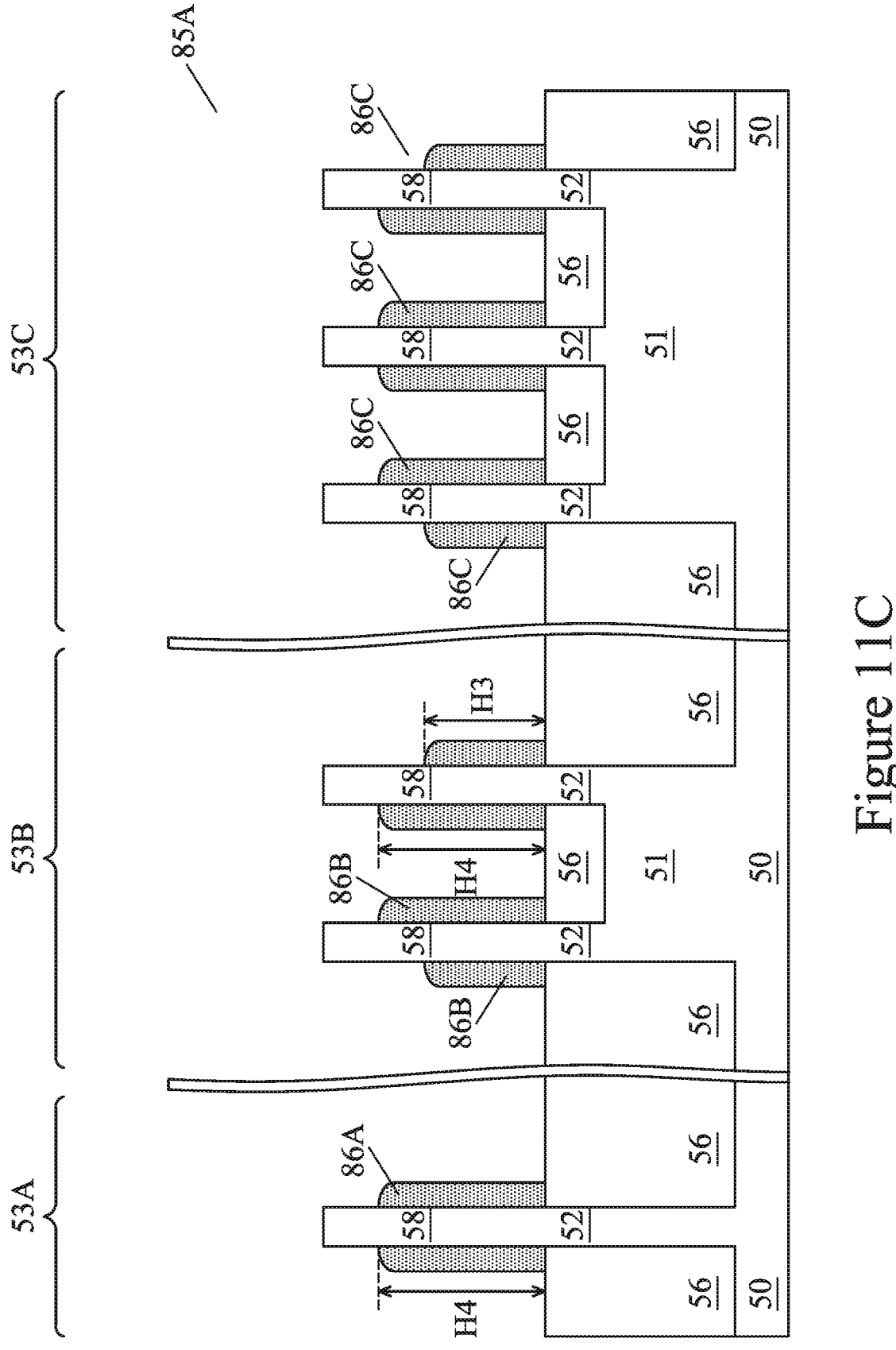

FIG. 11A-C illustrate cross-sectional views of a structure similar to that shown in FIGS. 8A-B, after formation of the gate spacers 86. FIG. 11A is illustrated along reference cross-section A-A as indicated in FIG. 1 and FIG. 10, FIG. 11B is illustrated along reference cross-section B-B as indicated in FIG. 1, and FIG. 11C is illustrated along reference cross-section C-C as indicated in FIG. 1 and FIG. 10. The gate spacers 86 in region 53A are designated as gate spacers 86A, the gate spacers 86 in region 53B are designated as gate spacers 86B, and the gate spacers 86 in region 53C are designated as gate spacers 86C. In some embodiments, the gate spacers 86 formed on the outermost fin sidewalls of multi-fin crown structures may have a different height than the gate spacers 86 formed on the interior fin sidewalls of multi-fin crown structures or on the sidewalls of single-fin structures. For example, as shown in FIG. 11C, the gate spacers 86 formed on outermost sidewalls have a height H3 that is less than the height H4 of the gate spacers 86 formed on inner sidewalls. In some embodiments, the height H3 may be in a range between about 10 nm and about 50 nm or the height H4 may be in a range between about 15 nm and about 50 nm, though other heights or combinations of heights are possible. In other embodiments, the height H3 and the height H4 are about the same.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 12:
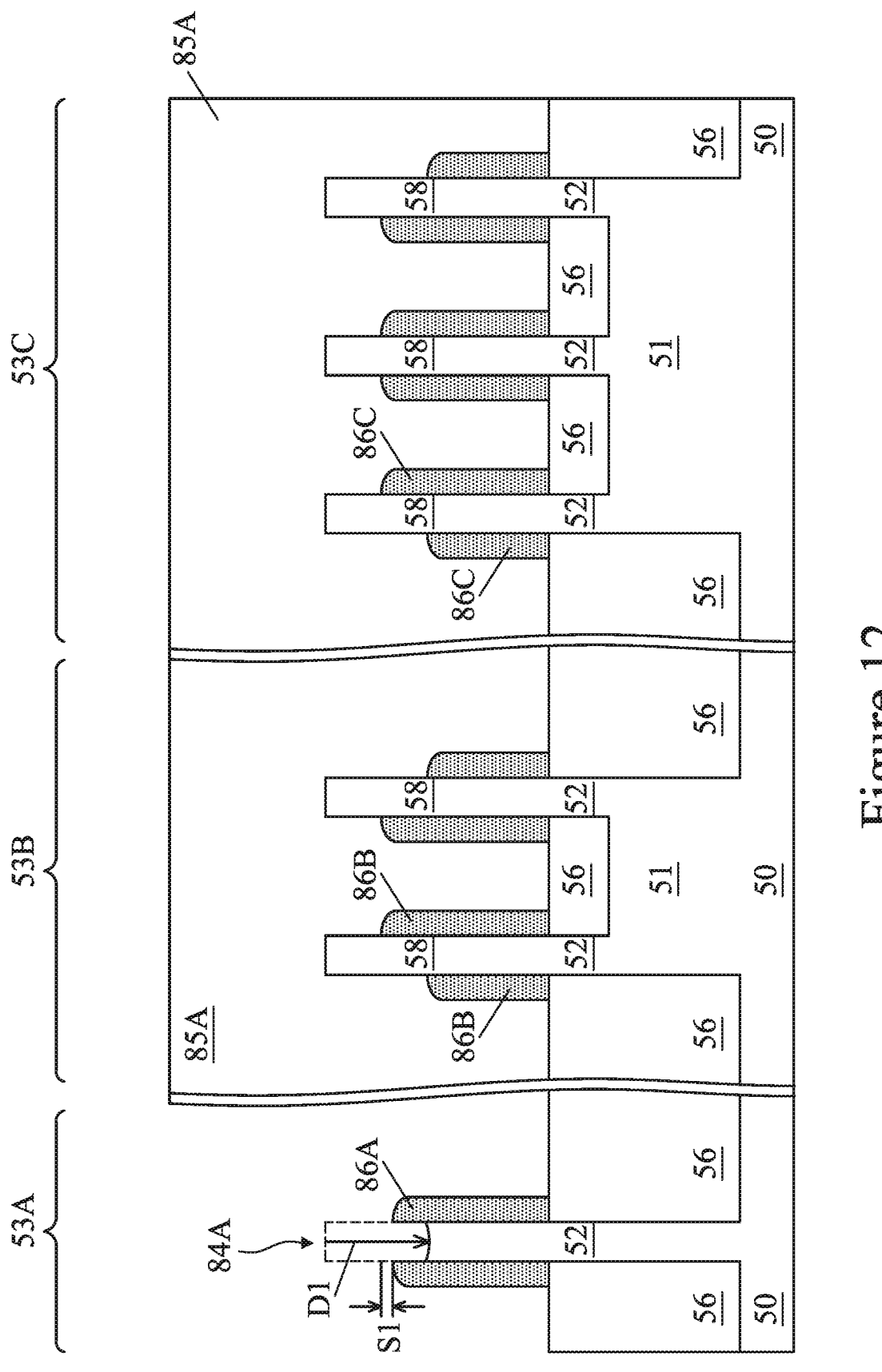
FIGS. 12, 13, 14, 15, 16, 17, 18A, 18B, 18C, and 18D are cross-sectional views of intermediate stages in the formation of epitaxial source/drain regions in the manufacturing of FinFETs, in accordance with some embodiments.
Figure 13:
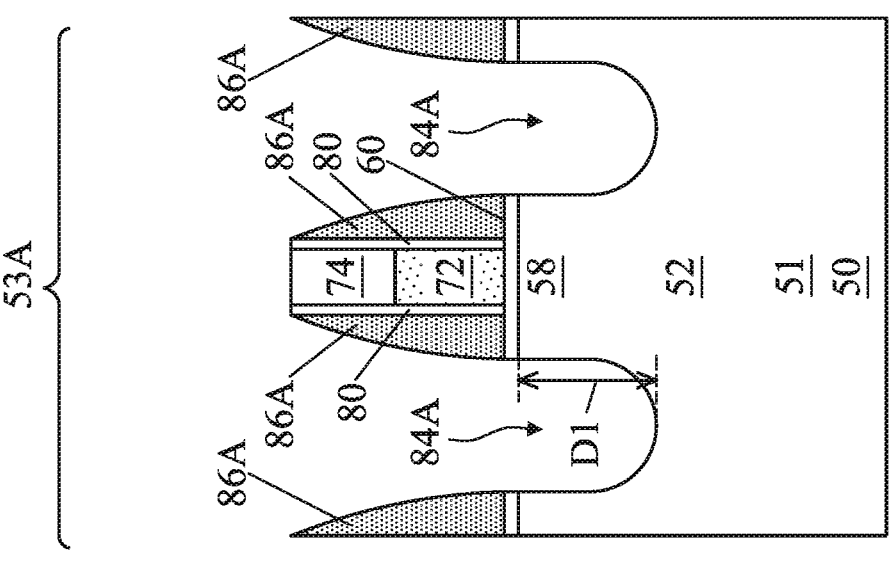
Figure 14:
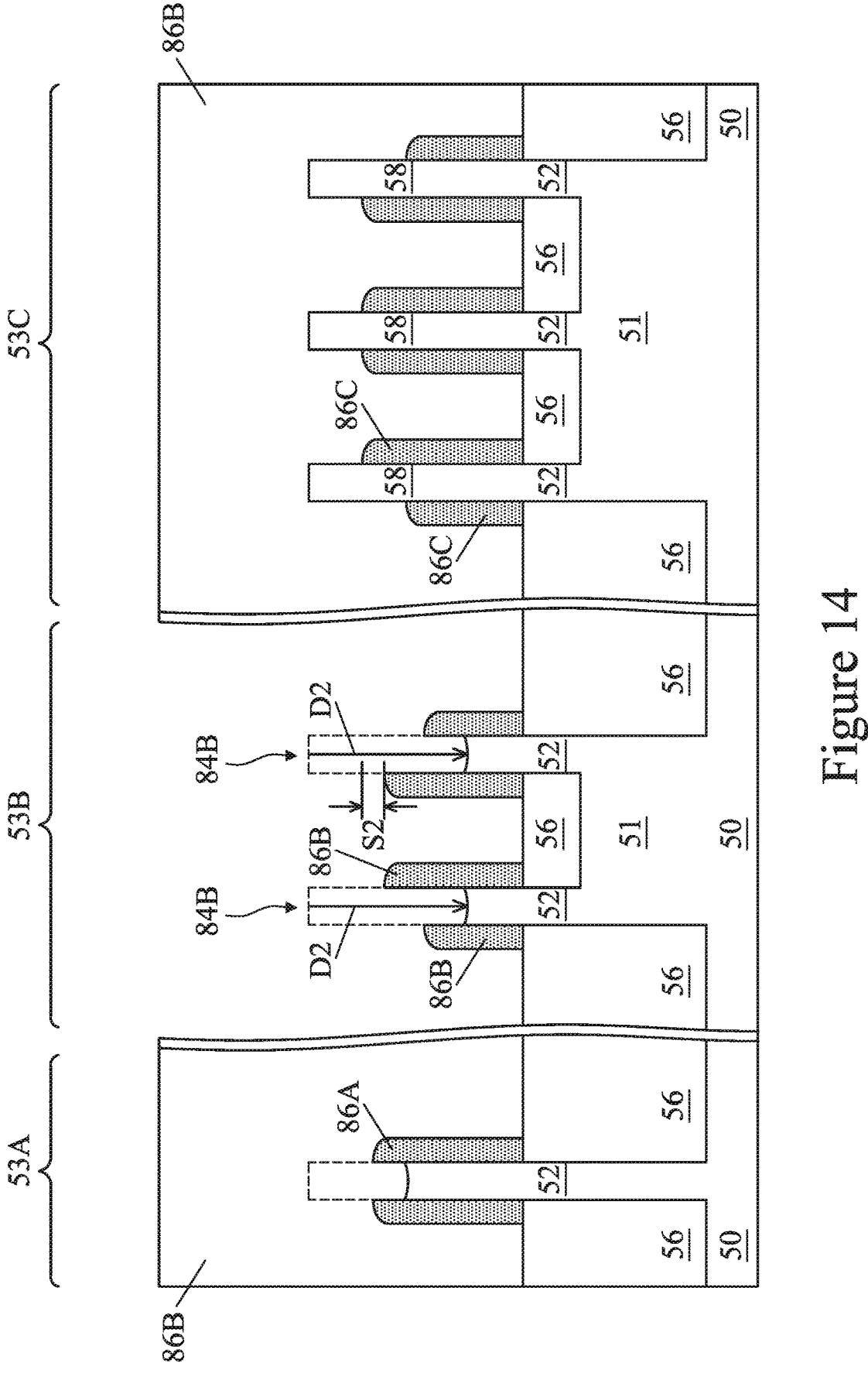
Figure 15:
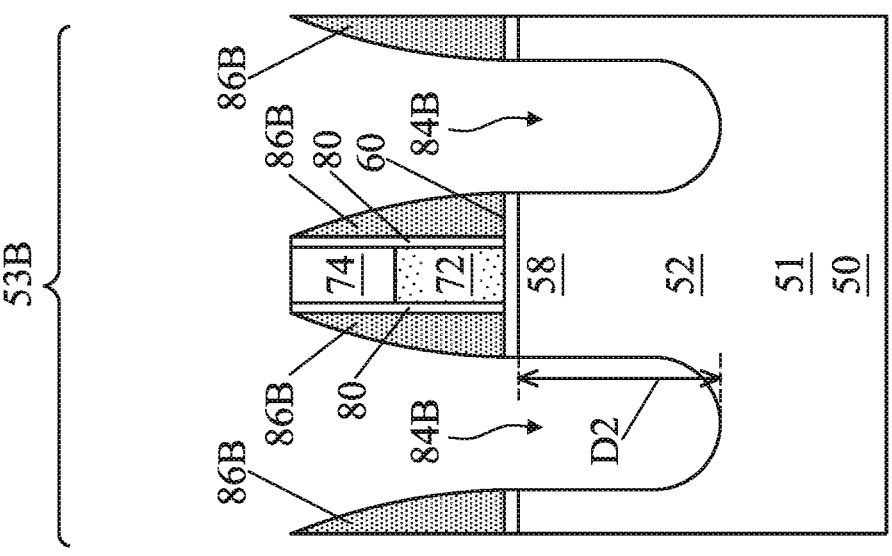
Figure 16:
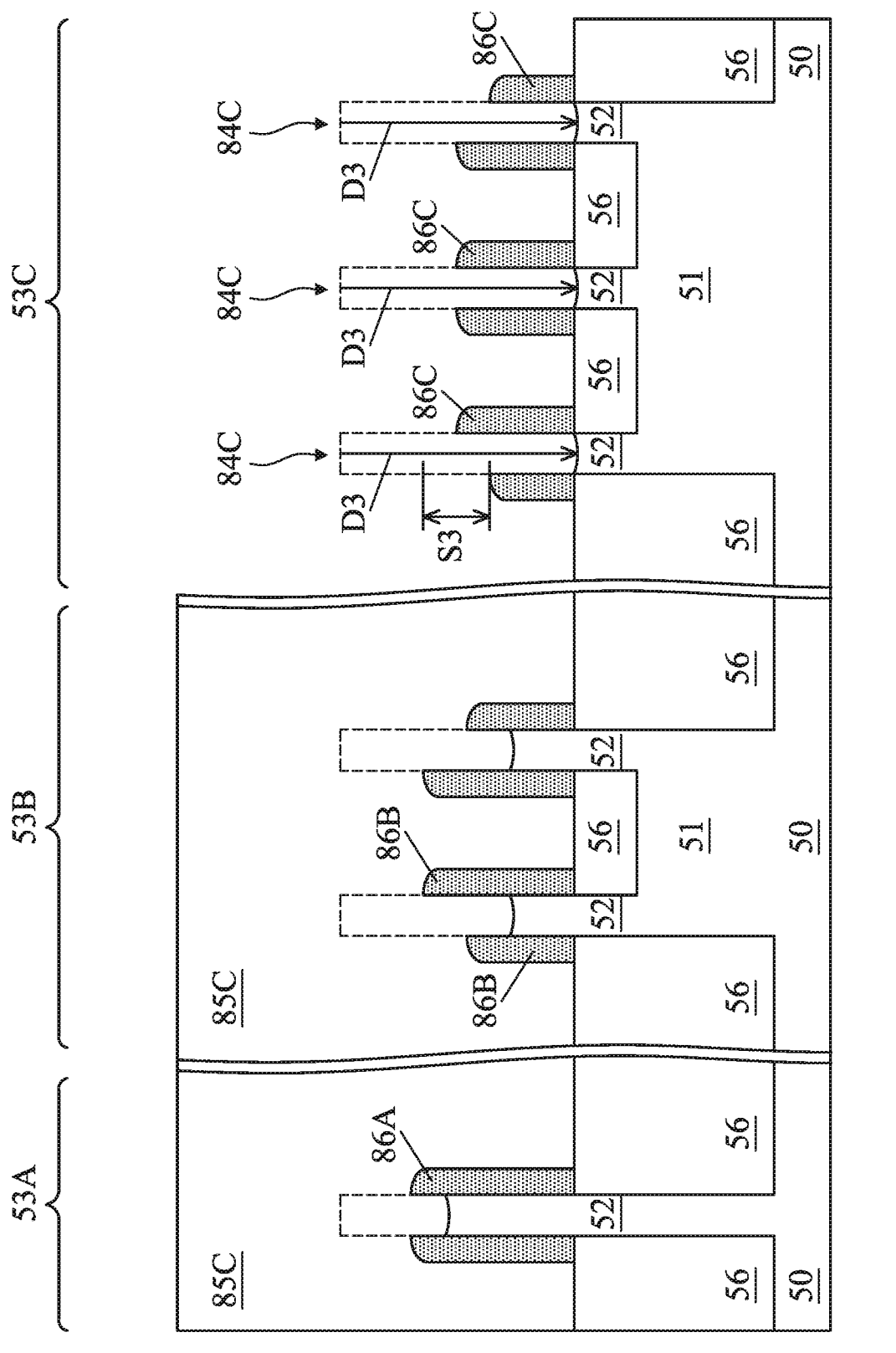

FIGS. 12 through 17 illustrate the formation of source/drain recesses 84 in the fins 52, in accordance with some embodiments. FIGS. 12, 14, and 16 are illustrated along reference cross-section C-C as indicated in FIG. 1 and FIG. 10, and FIGS. 13, 15, and 16 are illustrated along reference cross-section B-B as indicated in FIG. 1. In some embodiments, the recesses 84 within each separate region 53 are formed sequentially, using separate photolithography and etching steps. For example, in the embodiment shown in FIGS. 12-17, recesses 84A are first formed in the fins 52 of region 53A (see FIGS. 12-13), then recesses 84B are formed in the fins 52 of region 53B (see FIGS. 14-15), and then recesses 84C are formed in the fins 52 of region 53C (see FIGS. 16-17). In this manner, the formation of the recesses 84 in the multiple regions 53 may be considered a multi-cycle ("m-cycle") process. The regions 53 may be processed in this manner in any suitable order. By forming the recesses 84 of each region 53 separately, the recesses 84 of a region 53 may be formed having a depth more suitable for the devices formed in that region 53. For example, the single-fin structures of region 53A may have recesses 84A with a different depth than the recesses 84B of the double fin-structures of region 53B, and the recesses 84B of region 53B may have a different depth than the recesses 84C of region 53C. In this manner, the depth of the recesses 84 may be optimized for different regions 53.

In some embodiments, regions 53 associated with structures having a larger number of fins 52 may have recesses 84 that are deeper than regions 53 associated with structures having a smaller number of fins 52. For example, the recesses 84C formed in triple-fin structures of region 53C may be deeper than the recesses 84B formed in double-fin structures of region 53B, which may be deeper than the recesses 84A formed in single-fin structures of region 53A. In some cases, forming relatively deeper source/drain regions 82 in relatively larger multi-fin structures can increase the volume of the subsequently formed epitaxial source/drain regions 82 (see FIGS. 18B-D). Additionally, in some embodiments, etching deeper recesses 84 can reduce the height of the adjacent gate spacers 86, which can allow for greater lateral growth of the epitaxial source/drain regions 82 and thus form epitaxial source/drain regions 82 having a larger volume. In some cases, epitaxial source/drain regions 82 having larger volumes can increase the operating current of the larger multi-fin structures relative to smaller multi-fin structures and thus improve device performance. For example, a larger epitaxial source/drain region 82 may allow for a larger contact area which can reduce contact resistance of the source/drain contacts 112 (see FIG. 23B).

Turning to FIGS. 12 and 13, a photoresist 85A is formed over regions 53B and 53C, and recesses 84A are formed in region 53A, in accordance with some embodiments. In some embodiments, the photoresist 85A is formed over the regions 53A-C and then is patterned to expose some or all of the region 53A. The photoresist 85A may be, for example, a single-layer or multi-layer photoresist structure, which may be formed using spin-on techniques or other suitable techniques. The photoresist 85A may be patterned using acceptable photolithography techniques. The patterned photoresist 85A protects the regions 53B and 53C such that recesses (e.g., recesses 84A) are only formed in the fins 52 of region 53A. In the embodiment of FIG. 12, this means that recesses (e.g., recesses 84A) are only formed in single-fin structures.

In some embodiments, the recesses 84A may be etched in the fins 52 using a suitable anisotropic dry etching process that uses the masks 74, the gate spacers 86A, and/or the STI regions 56 as a combined etching mask. The suitable anisotropic dry etching process may include, for example, a reactive ion etch (RIE), a neutral beam etch (NBE), the like, or a combination thereof. In some embodiments in which an RIE is used, various process parameters such as, for example, a process gas mixture, a voltage bias, and/or an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and thus increase a rate of physical etching. In this manner, the depth D1 of the recesses 84A may be controlled by controlling the voltage bias and/or the duration of time the etching is performed. In some embodiments, the anisotropic etching process may be performed using a process gas mixture including $CH_3F$, $CH_4$, HBr, $O_2$, Ar, $Cl_2$, $NF_3$, the like, or a combination thereof. In some embodiments, the patterning process forms recesses 84A having U-shaped bottom surfaces, such as shown in FIG. 13.

In some embodiments, the recesses 84A formed in region 53A may have a vertical depth D1 that is between about 20 nm and about 70 nm from the top surface of the fins 52. In some embodiments, the gate spacers 86A in region 53A are also etched during the etching of the recesses 84A, which may reduce the height of the gate spacers 86A. In some embodiments, the height of the gate spacers 86A may be reduced (e.g., from the height H4) by a vertical distance S1 that is between about 20 nm and about 70 nm. In some cases, a larger depth D1 or height reduction S1 may result in epitaxial source/drain regions 82A (see FIGS. 18B-D) having a larger volume. After performing the etching process in region 53A, the photoresist 85A is removed, such as using an acceptable ashing process.

Turning to FIGS. 14 and 15, a photoresist 85B is formed over regions 53A and 53C, and recesses 84B are formed in region 53B, in accordance with some embodiments. In some embodiments, the photoresist 85B is formed over the regions 53A-C and then is patterned to expose some or all of the region 53B. The photoresist 85B may be similar to the photoresist 85A, and may be formed using a similar process. The patterned photoresist 85B protects the regions 53A and 53C such that recesses (e.g., recesses 84B) are only formed in the fins 52 of region 53B. In the embodiment of FIG. 14, this means that recesses (e.g., recesses 84B) are only formed in double-fin structures.

In some embodiments, the recesses 84B may be etched in the fins 52 using a suitable anisotropic dry etching process that uses the masks 74, the gate spacers 86B, and/or the STI regions 56 as a combined etching mask. The anisotropic dry etching process may be similar to that used for etching the recesses 84A in region 53A. In some embodiments, the depth D2 of the recesses 84B may be controlled by controlling the voltage bias and/or the duration of time the etching is performed. For example, the voltage bias and/or the duration of time may be greater than that used to etch the recesses 84A, and thus the recesses 84B may be formed having a depth D2 that is greater than the depth D1 of the recesses 84A. The depth D2 may be such that a bottom surface of the recesses 84B are below a top surface of the STI regions 56, but in other cases a bottom surface of the recesses 84B may be above a top surface of the STI regions 56 or about level with a top surface of the STI region 56.

In some embodiments, the recesses 84B formed in region 53B may have a vertical depth D2 that is between about 30 nm and about 80 nm from the top surface of the fins 52. In some embodiments, the depth D2 of the recesses 84B may be between about 5 nm and about 20 nm deeper than the depth D1 of the recesses 84A, though other depth differences are possible. In some embodiments, the gate spacers 86B in region 53B are also etched during the etching of the recesses 84B, which may reduce the height of the gate spacers 86B. In some embodiments, the height of the gate spacers 86B may be reduced (e.g., from the height H3 or the height H4) by a vertical distance S2 that is between about 30 nm and about 80 nm. In some cases, a larger depth D2 or height reduction S2 may result in epitaxial source/drain regions 82B (see FIGS. 18B-D) having a larger volume. In particular, the epitaxial source/drain regions 82B may be formed having a larger volume than the epitaxial source/drain regions 82A. After performing the etching process in region 53B, the photoresist 85B is removed, such as using an acceptable ashing process.

Figure 17:
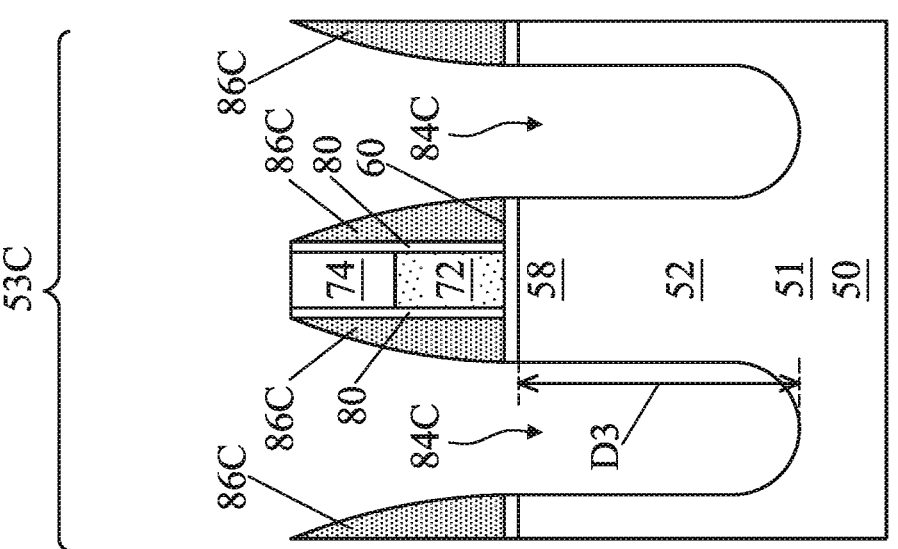

Turning to FIGS. 16 and 17, a photoresist 85C is formed over regions 53A and 53B, and recesses 84C are formed in region 53C, in accordance with some embodiments. In some embodiments, the photoresist 85C is formed over the regions 53A-C and then is patterned to expose some or all of the region 53C. The photoresist 85C may be similar to the photoresist 85A, and may be formed using a similar process. The patterned photoresist 85C protects the regions 53A and 53B such that recesses (e.g., recesses 84C) are only formed in the fins 52 of region 53C. In the embodiment of FIG. 16, this means that recesses (e.g., recesses 84C) are only formed in associated multi-fin structures such as structures having three fins 52.

In some embodiments, the recesses 84C may be etched in the fins 52 using a suitable anisotropic dry etching process that uses the masks 74, the gate spacers 86C, and/or the STI regions 56 as a combined etching mask. The anisotropic dry etching process may be similar to that used for etching the recesses 84A in region 53A or etching the recesses 84B in region 53B. In some embodiments, the depth D3 of the recesses 84C may be controlled by controlling the voltage bias and/or the duration of time the etching is performed. For example, the voltage bias and/or the duration of time may be greater than that used to etch the recesses 84B, and thus the recesses 84C may be formed having a depth D3 that is greater than the depth D2 of the recesses 84B. The depth D3 may be such that a bottom surface of the recesses 84C are below a top surface of the STI regions 56, but in other cases a bottom surface of the recesses 84C may be above a top surface of the STI regions 56 or about level with a top surface of the STI region 56.

In some embodiments, the recesses 84C formed in region 53C may have a vertical depth D3 that is between about 40 nm and about 90 nm from the top surface of the fins 52. In some embodiments, the depth D3 of the recesses 84C may be between about 7 nm and about 27 nm deeper than the depth D1 of the recesses 84A, though other depth differences are possible. In some embodiments, the depth D3 of the recesses 84C may be between about 2 nm and about 7 nm deeper than the depth D2 of the recesses 84B, though other depth differences are possible. In some embodiments, the gate spacers 86C in region 53C are also etched during the etching of the recesses 84C, which may reduce the height of the gate spacers 86C. In some embodiments, the height of the gate spacers 86C may be reduced (e.g., from the height H3 or the height H4) by a vertical distance S3 that is between about 40 nm and about 90 nm. In some cases, a larger depth D3 or height reduction S3 may result in epitaxial source/drain regions 82C (see FIGS. 18B-D) having a larger volume. In particular, the epitaxial source/drain regions 82C may be formed having a larger volume than the epitaxial source/drain regions 82A or 82B. After performing the etching process in region 53C, the photoresist 85C is removed, such as using an acceptable ashing process.

The process described in FIGS. 12-17 for forming recesses 84 in regions 53 is an example, and other embodiments may have more or fewer regions 53 or may have different types of structures within each region 53. The depth and height differences between the recesses 84 and/or gate spacers 86 in each region 53 may also be different than shown or described. In some embodiments, a region 53 may be associated with multi-fin structures having more than three fins. In these embodiments, this multi-fin region 53 may have recesses 84 formed in a similar manner as for regions 53A-C. In some embodiments, the recesses 84 formed in this multi-fin region 53 may have a vertical depth that is between about 20 nm and about 90 nm from the top surface of the fins 52. In some embodiments, the recesses 84 formed in this multi-fin region may be between about 7 nm and about 32 nm deeper than the depth D1 of the recesses 84A, may be between about 2 nm and about 12 nm deeper than the depth D2 of the recesses 84B, or may be between about 0 nm and about 5 nm deeper than the depth D3 of the recesses 84C, though other depth differences are possible. These and other variations are considered within the scope of the present disclosure.

In FIGS. 18A, 18B, 18C, and 18D, epitaxial source/drain regions 82 are formed in the fins 52, in accordance with some embodiments. The epitaxial source/drain regions 82 in each region 53A-C may be formed simultaneously or in separate epitaxial growth steps. In FIGS. 18A-D, the epitaxial source/drain regions 82 are designated as epitaxial source/drain regions 82A for region 53A, epitaxial source/drain regions 82B for region 53B, and epitaxial source/drain regions 82C for region 53C. The epitaxial source/drain regions 82 are formed in the fins 52 such that each dummy gate 72 is disposed between respective neighboring pairs of the epitaxial source/drain regions 82. In some embodiments, the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 are epitaxially grown in the recesses 84. The epitaxial source/drain regions 82 may include any acceptable material, such as appropriate for n-type FinFETs or p-type FinFETs. For example, if the fin 52 is silicon, the epitaxial source/drain regions 82 in an n-type region may include materials exerting a tensile strain in the channel region 58, such as silicon, silicon carbide, phosphorous doped silicon carbide, silicon phosphide, or the like. The epitaxial source/drain regions 82 in the n-type regions may have surfaces raised from respective surfaces of the fins 52 and may have facets. As another example, if the fin 52 is silicon, the epitaxial source/drain regions 82 in a p-type region may comprise materials exerting a compressive strain in the channel region 58, such as silicon-germanium, boron doped silicon-germanium, germanium, germanium tin, or the like. The epitaxial source/drain regions 82 in the p-type region may have surfaces raised from respective surfaces of the fins 52 and may have facets. The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 18A:
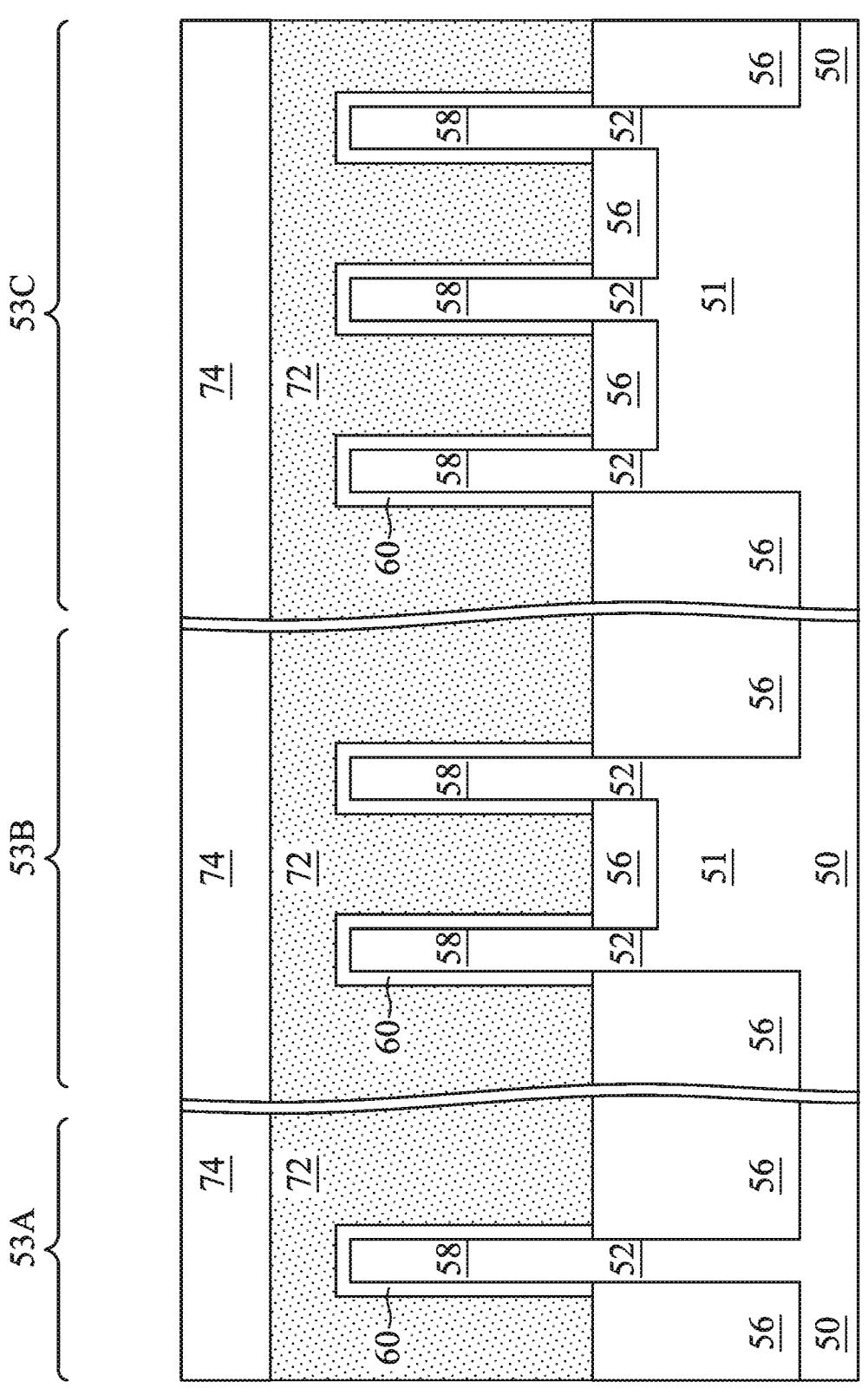

As a result of the epitaxy processes used to form the epitaxial source/drain regions 82, upper surfaces of the epitaxial source/drain regions 82 may have facets which expand laterally outward beyond sidewalls of the fins 52. The lateral growth of the epitaxial source/drain regions 82 may be blocked by the presence of the gate spacers, and thus the height of the gate spacers 86 on each fin 52 may determine the height at which the epitaxial source/drain region 82 expands laterally. In some embodiments, the facets cause adjacent source/drain regions 82 of a same fin structure to merge, as illustrated by FIG. 18C. In other embodiments, adjacent source/drain regions 82 remain separated after the epitaxy process is completed, as illustrated by FIG. 18D. In some other embodiments, the spacer etch used to form the gate spacers 86 may be adjusted to remove the spacer layer 83 to allow the epitaxially grown region to extend to the surface of the STI regions 56.

Figure 18B:
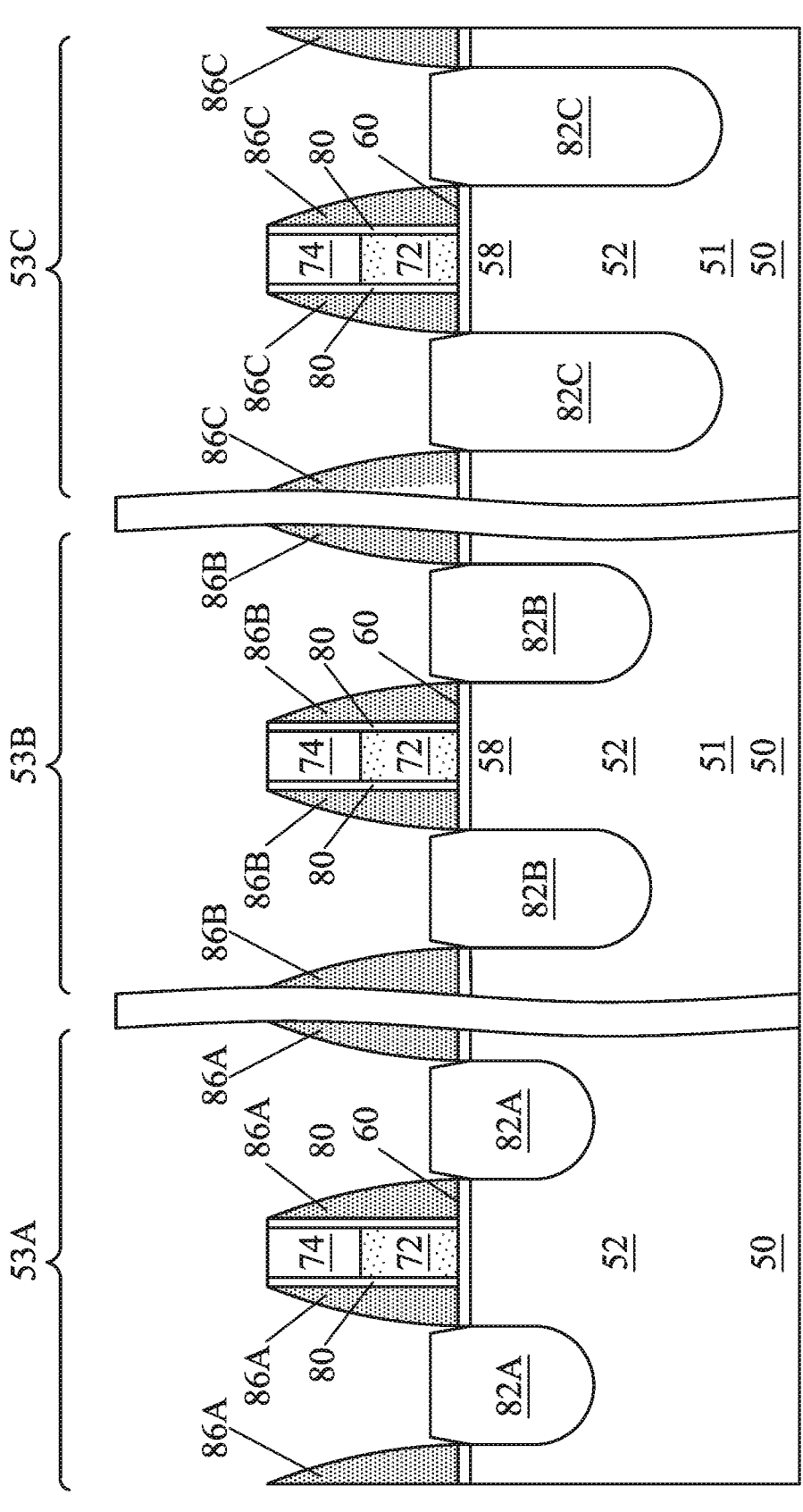
Figure 18C:
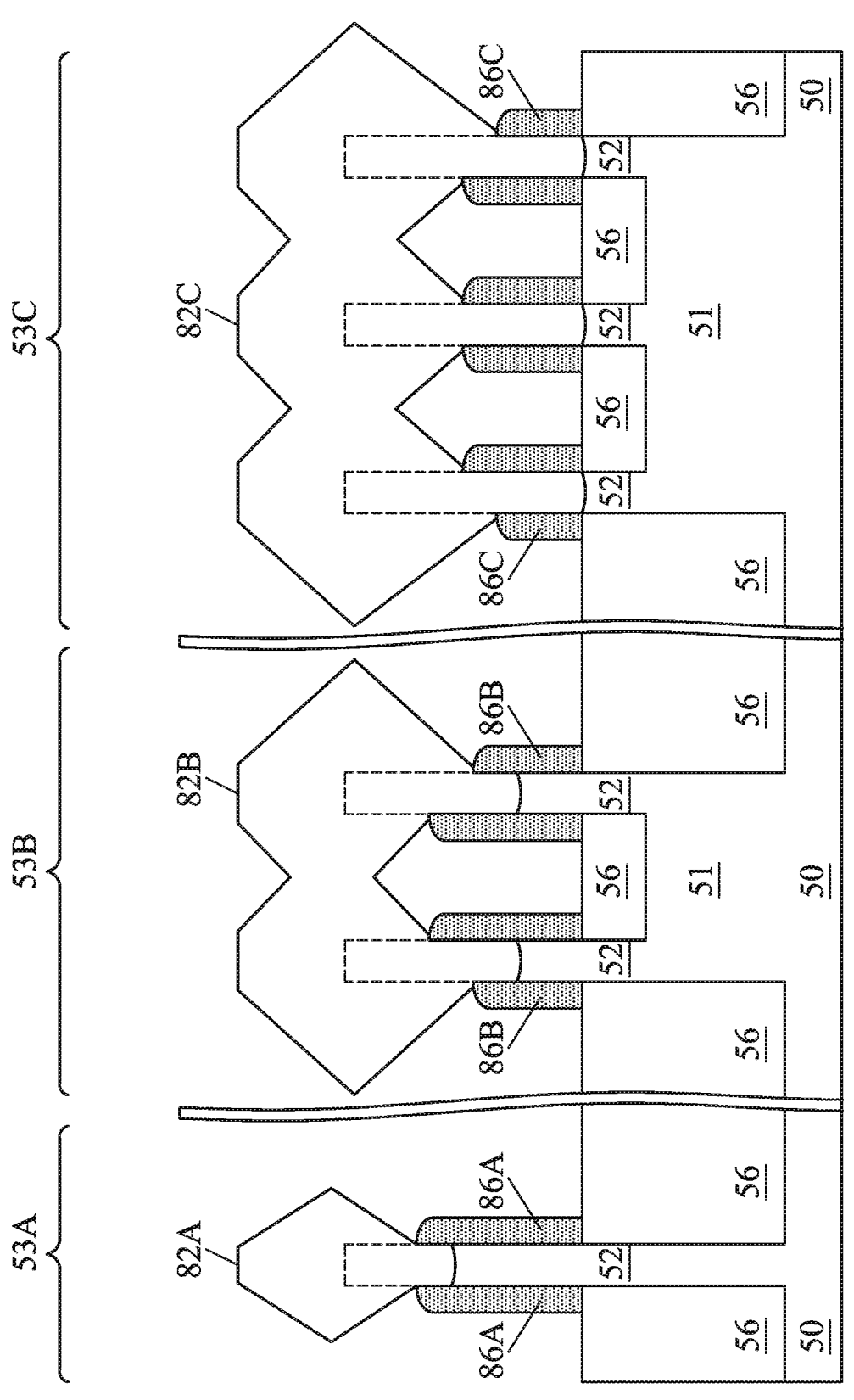
Figure 18D:
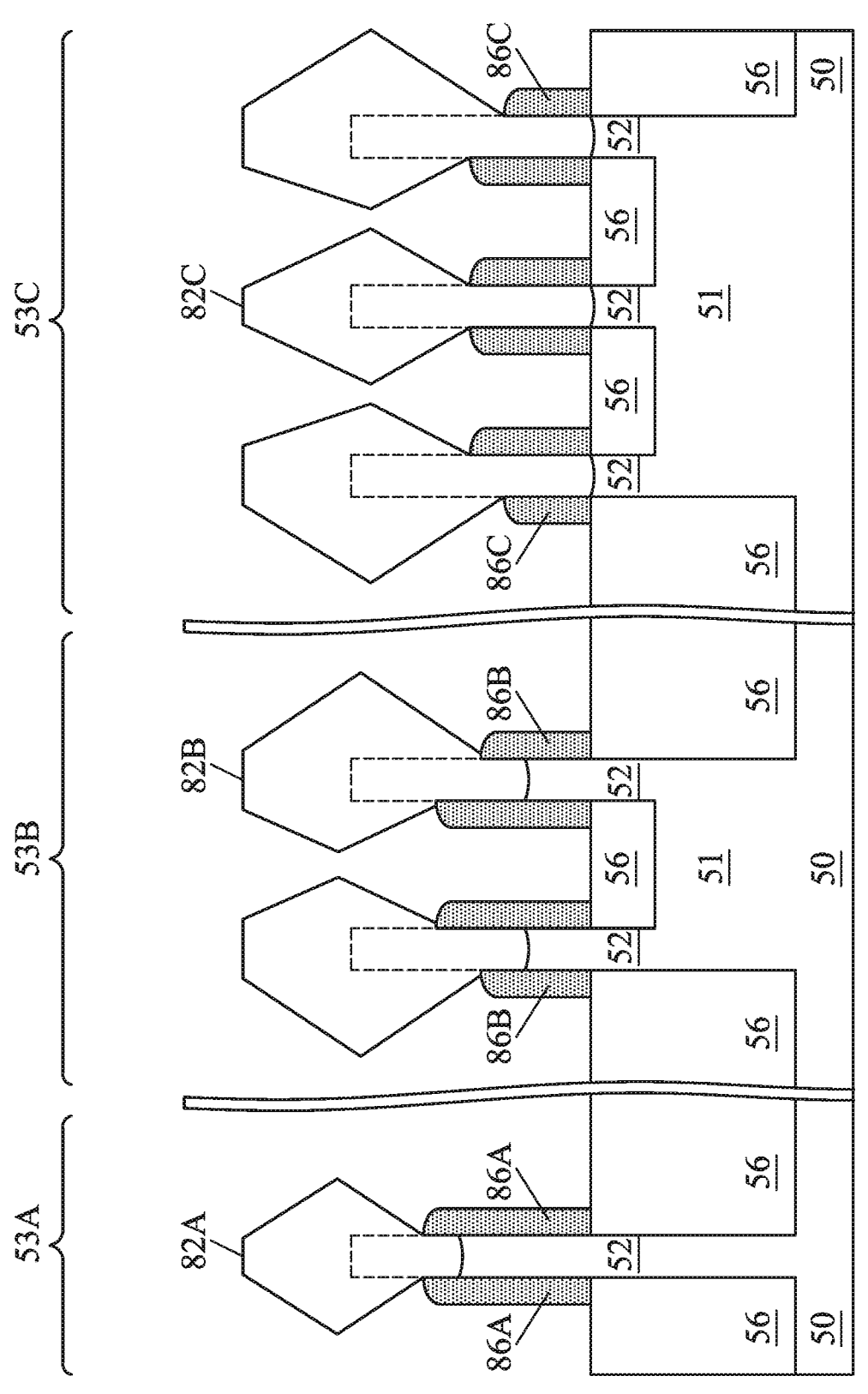

As shown in FIGS. 18B-D, etching deeper recesses 84 in a region 53 allows for the epitaxial source/drain regions 82 to be formed having a greater volume in that region 53. Additionally, reducing the height of the gate spacers 86 in a region 53 allows for greater lateral growth of the epitaxial source/drain regions 82 in that region 53, which also allows for the epitaxial source/drain regions 82 to be formed having a greater volume in that region 53. In this manner, fin structures having different numbers of fins 52 may be associated with different regions 53, and then the etching of recesses 84 within each region controlled to control the volume of the epitaxial source/drain regions 82 in each region. For example, the epitaxial source/drain regions 82C in region 53C may have a larger volume than the epitaxial source/drain regions 82B in region 53B, which may have a larger volume than the epitaxial source/drain regions 82A in region 53A. In some embodiments, a double-fin structure (e.g., region 53B) may have an epitaxial source/drain region 82 that has a volume between about 50% and about 1000% of a single-fin structure (e.g., region 53A). In some embodiments, a triple-fin structure (e.g., region 53C) may have an epitaxial source/drain region 82 that has a volume between about 50% and about 1000% of a double-fin structure (e.g., region 53B). As such, the ratio of the volume of the epitaxial source/drain region 52 formed in each fin 52 to the number of fins 52 in each structure is larger for regions 53 having a greater number of fins 52 in each structure than for regions 53 having a smaller number of fins 52 in each structure. These are examples, and other combinations are possible. Forming different epitaxial source/drain regions 82 in different regions 53 in this manner can allow for the epitaxial source/drain regions 82 to be optimized for certain types of devices or multi-fin structures and thus can allow for improved device performance.

Figure 19A:
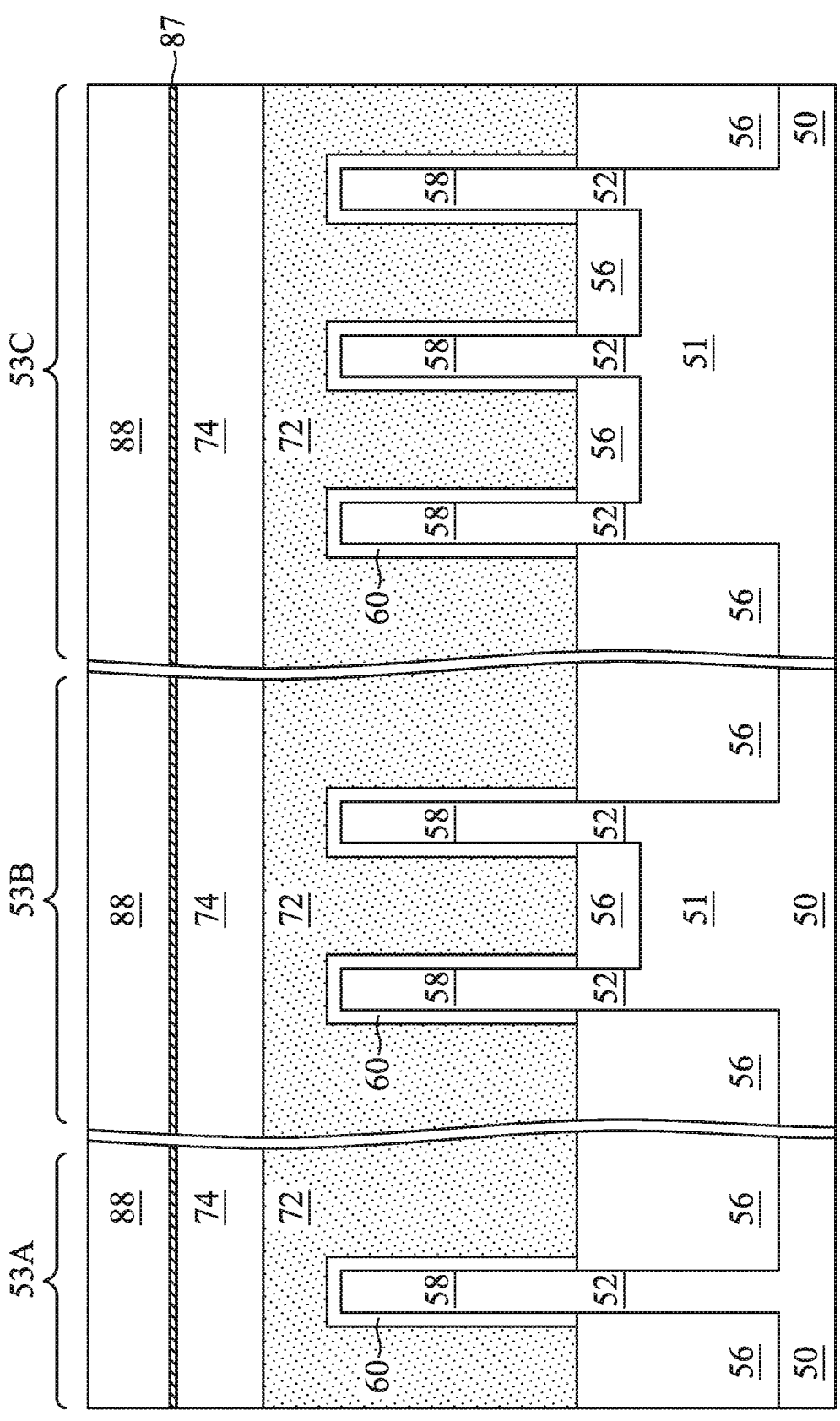
FIGS. 19A, 19B, 20A, 20B, 21A, 21B, 22A, 22B, 22C, 23A, and 23B are cross-sectional views of intermediate stages in the manufacturing of FinFETs, in accordance with some embodiments.
Figure 19B:
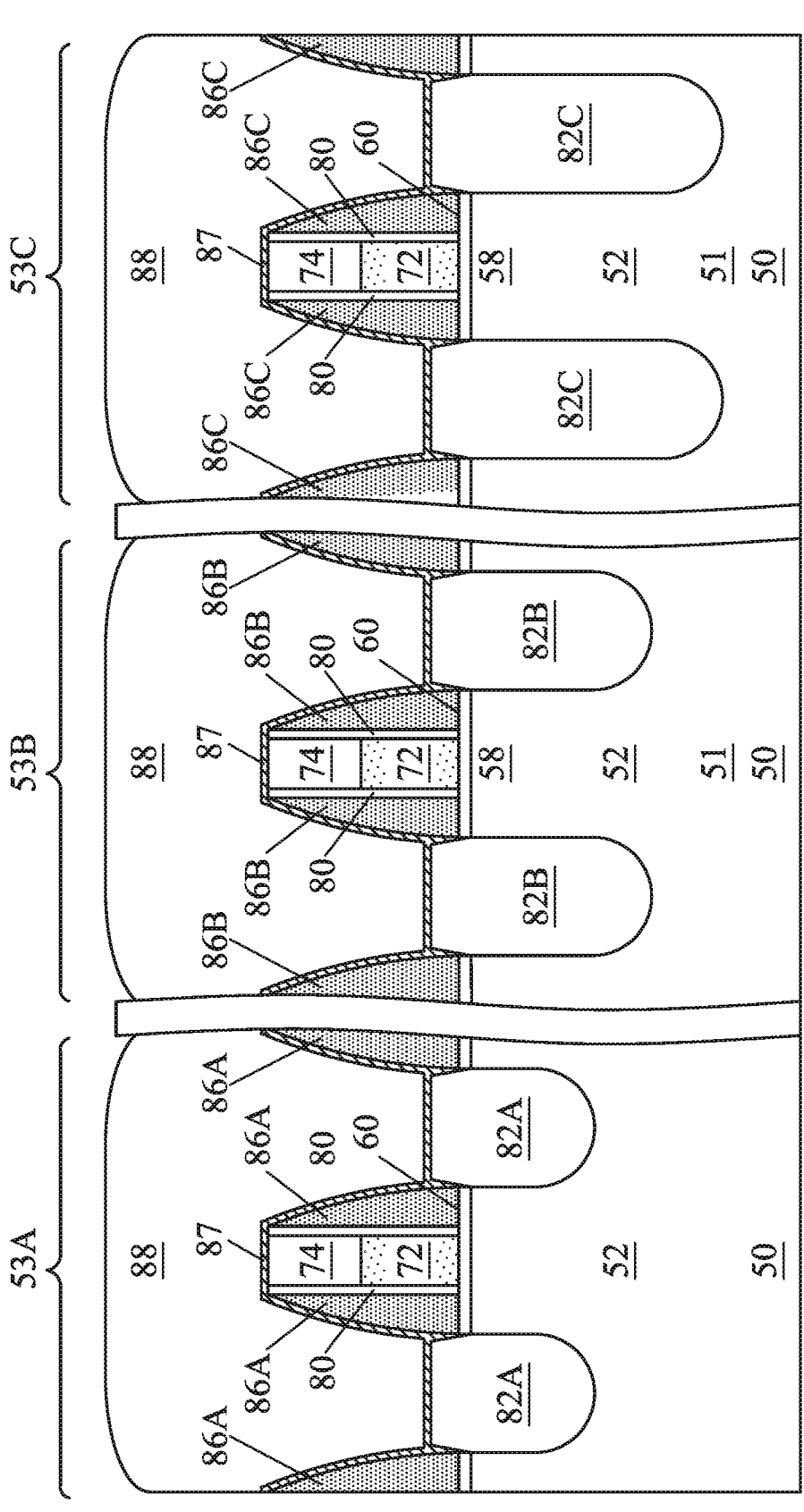

In FIGS. 19A and 19B, a first interlayer dielectric (ILD) 88 is deposited over the structure illustrated in FIGS. 18A and 18B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 20A:
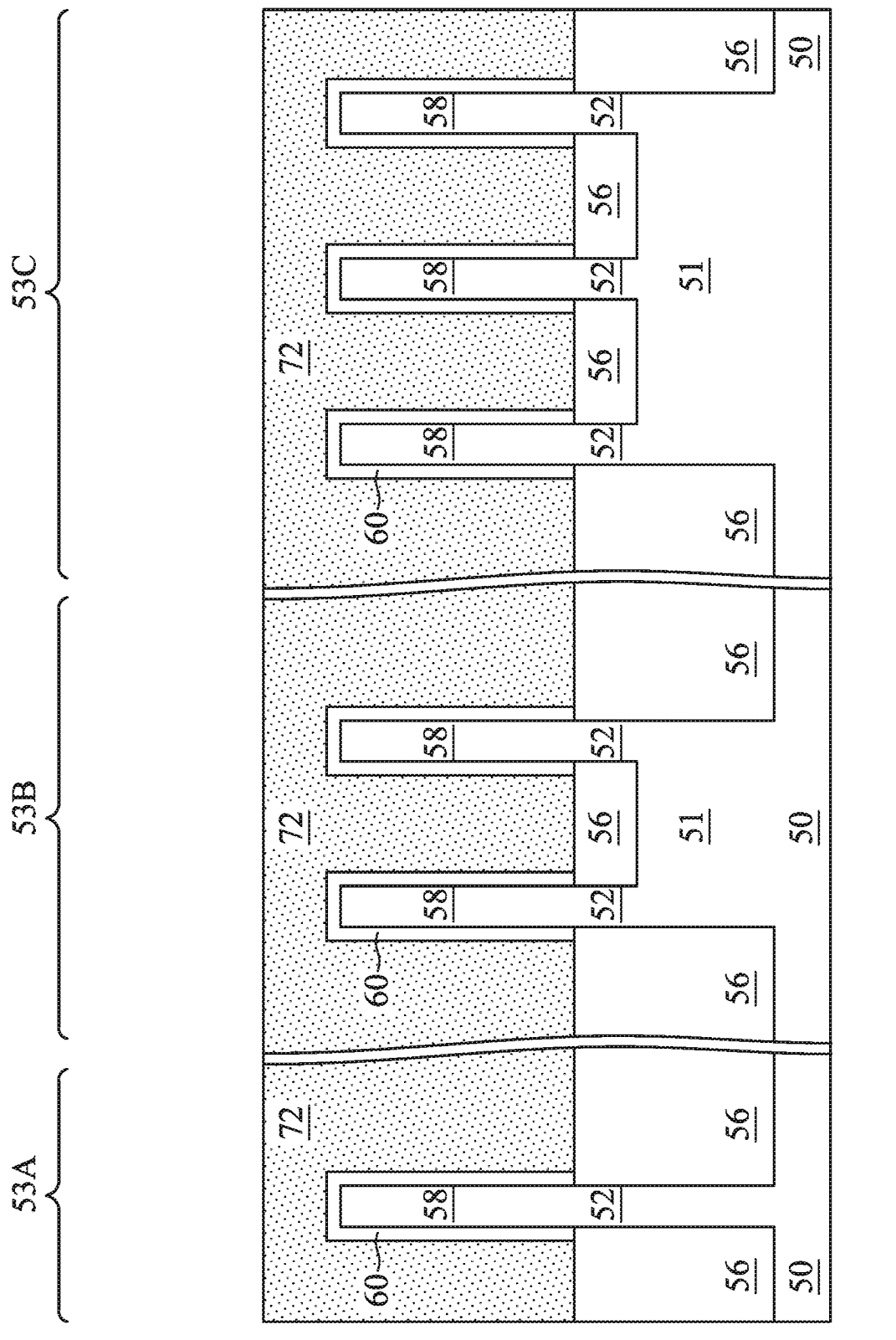
Figure 20B:
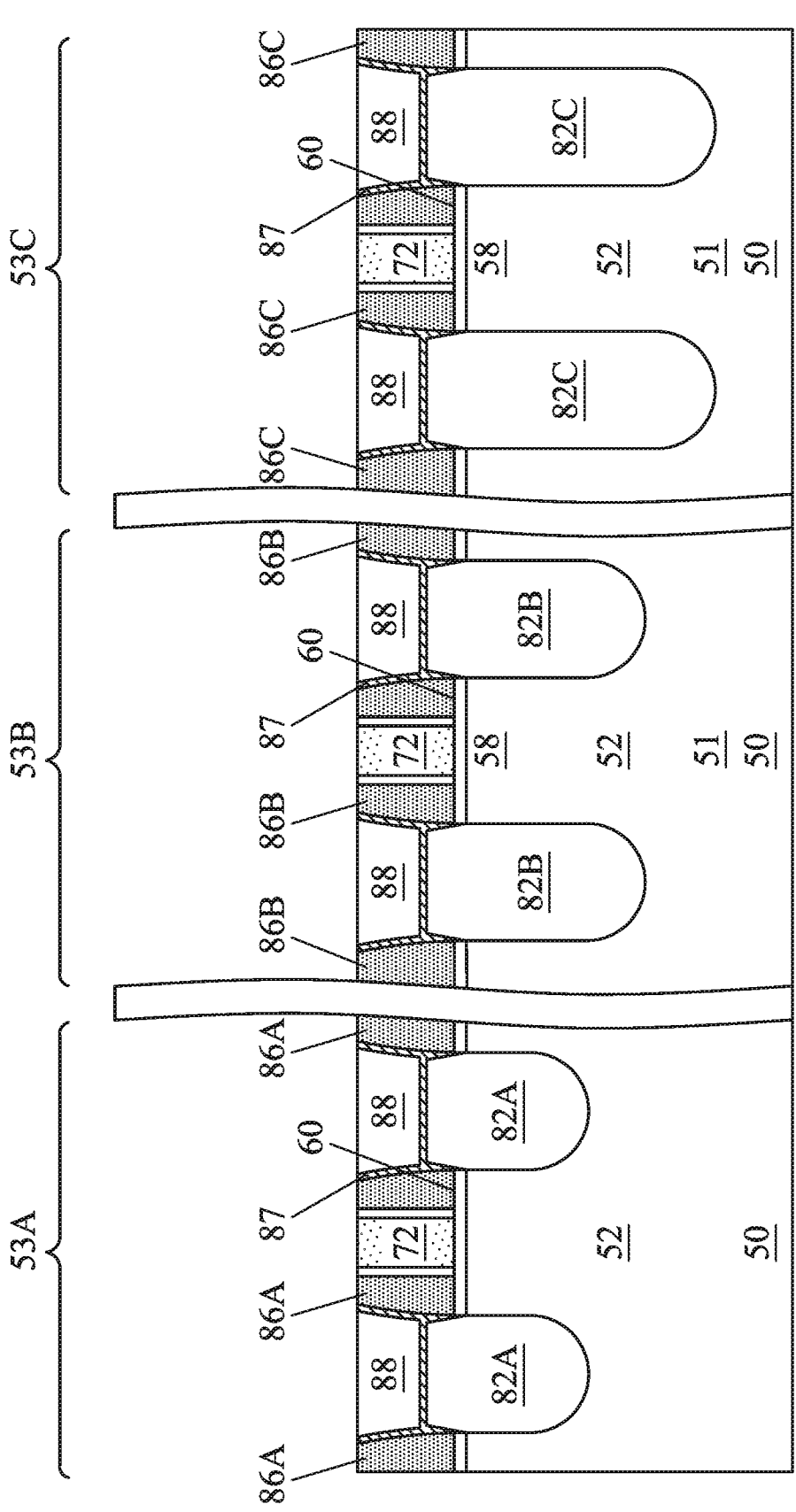

In FIGS. 20A and 20B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 21A:
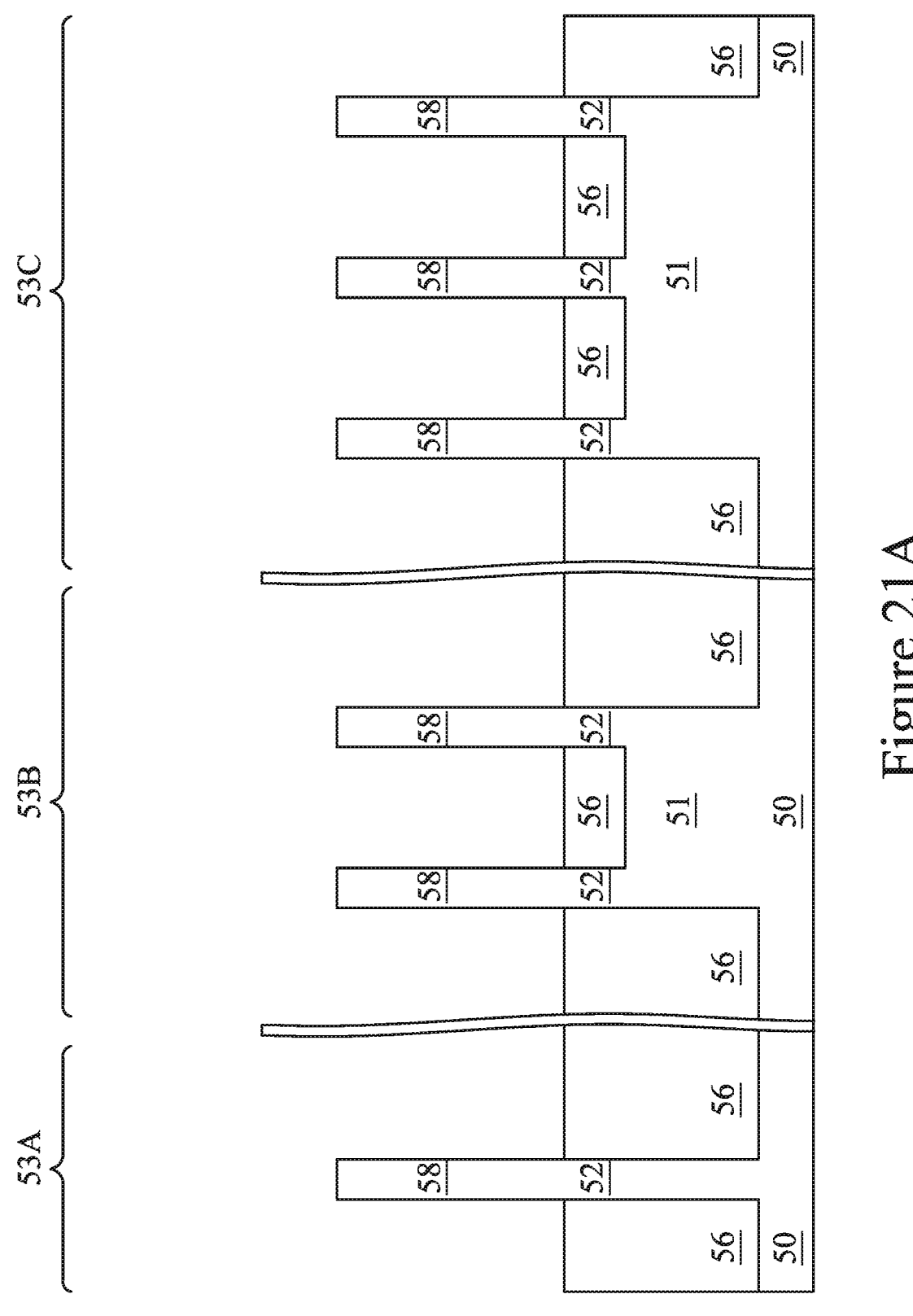
Figure 21B:
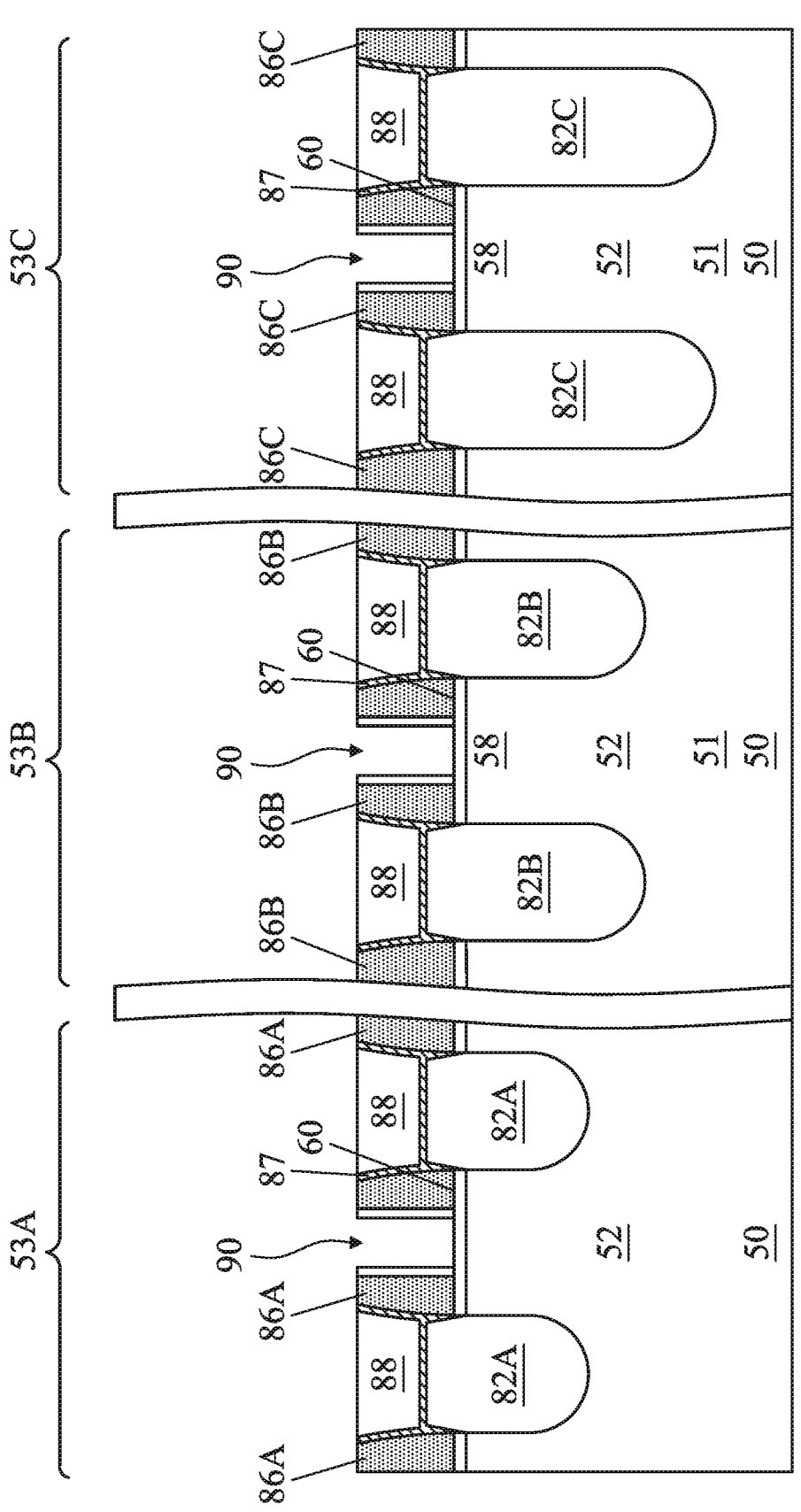

In FIGS. 21A and 21B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 22A:
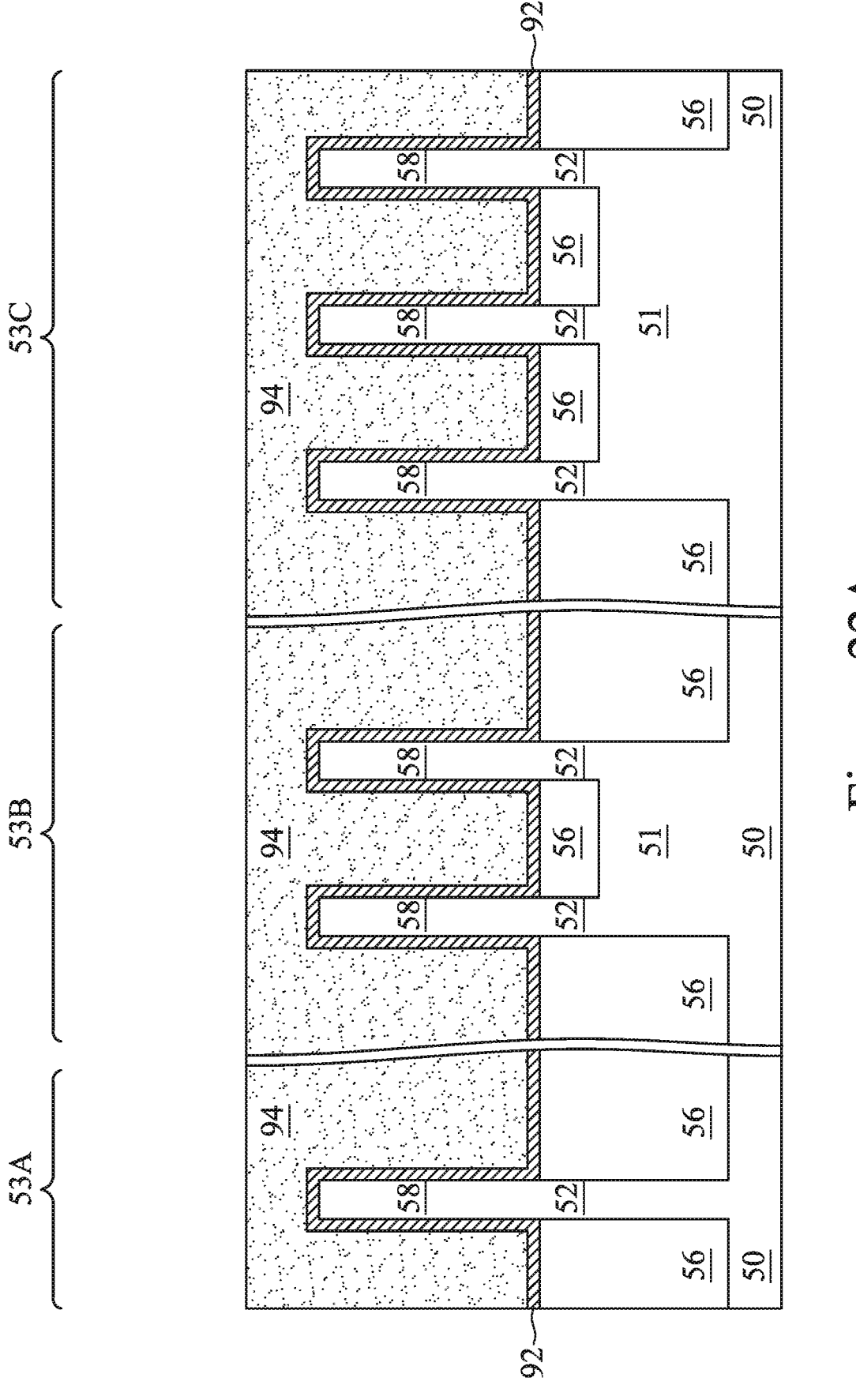
Figure 22B:
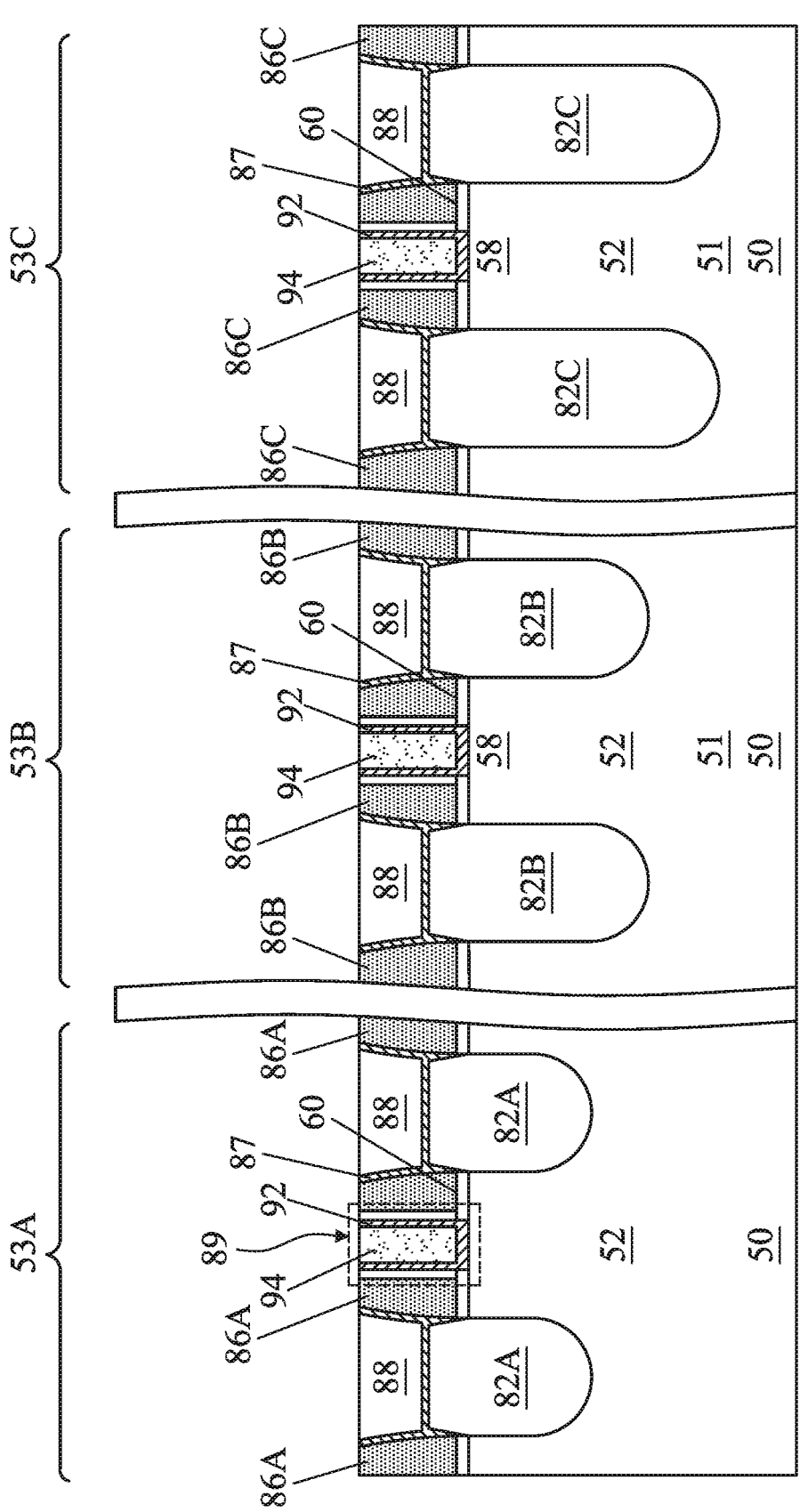
Figure 22C:
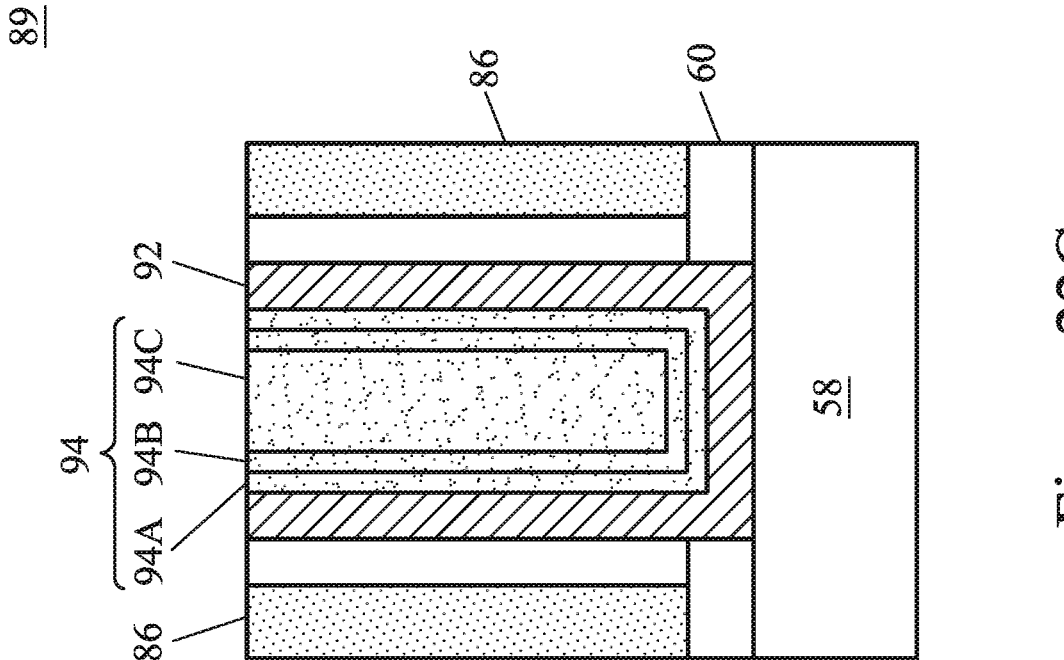

In FIGS. 22A and 22B, gate dielectric layers 92 and gate electrodes 94 are formed for replacement gates. FIG. 22C illustrates a detailed view of region 89 of FIG. 22B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 22B, the gate electrode 94 may comprise any number of liner layers 94A, any number of work function tuning layers 94B, and a fill material 94C as illustrated by FIG. 22C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in n-type regions and p-type regions may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 23A:
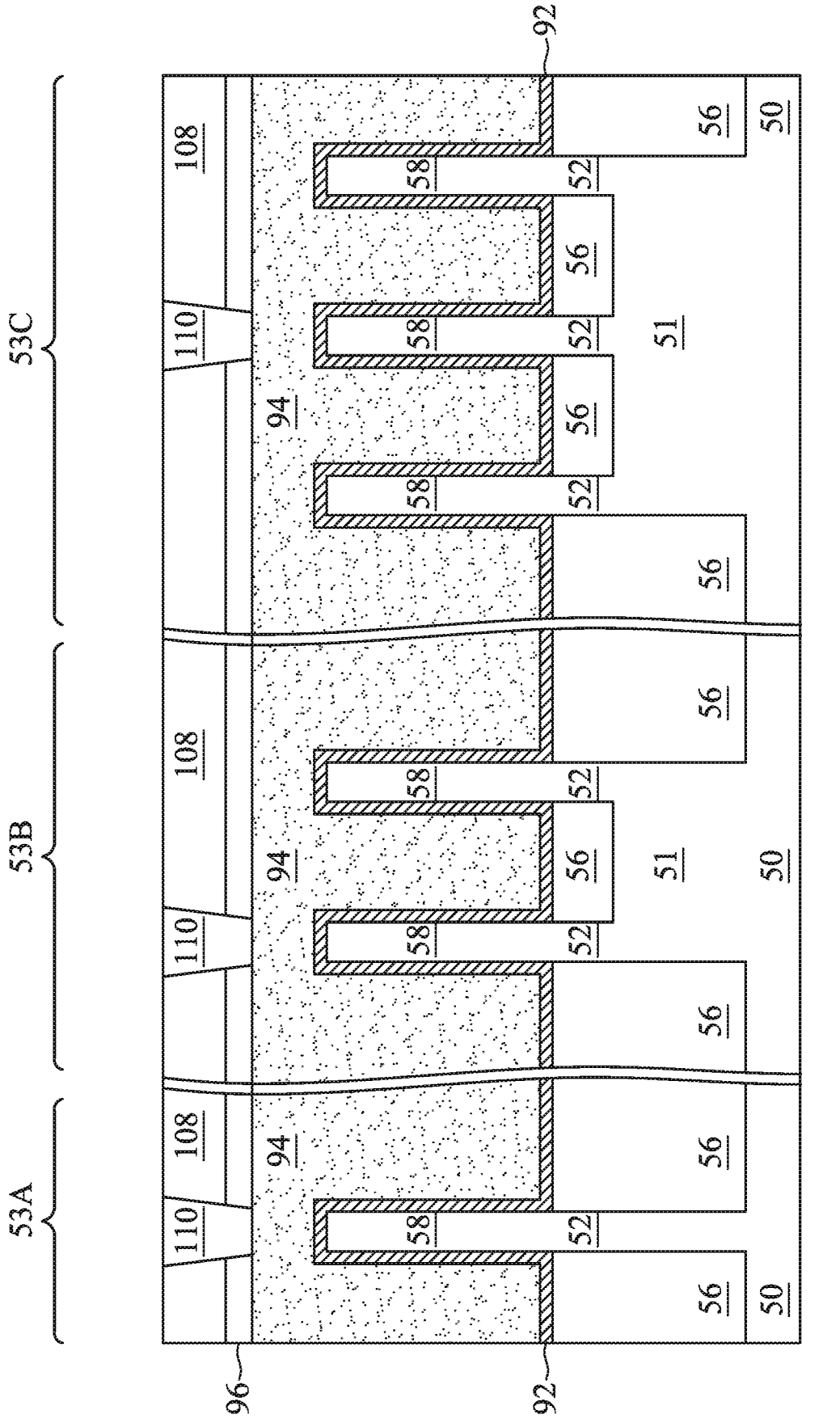
Figure 23B:
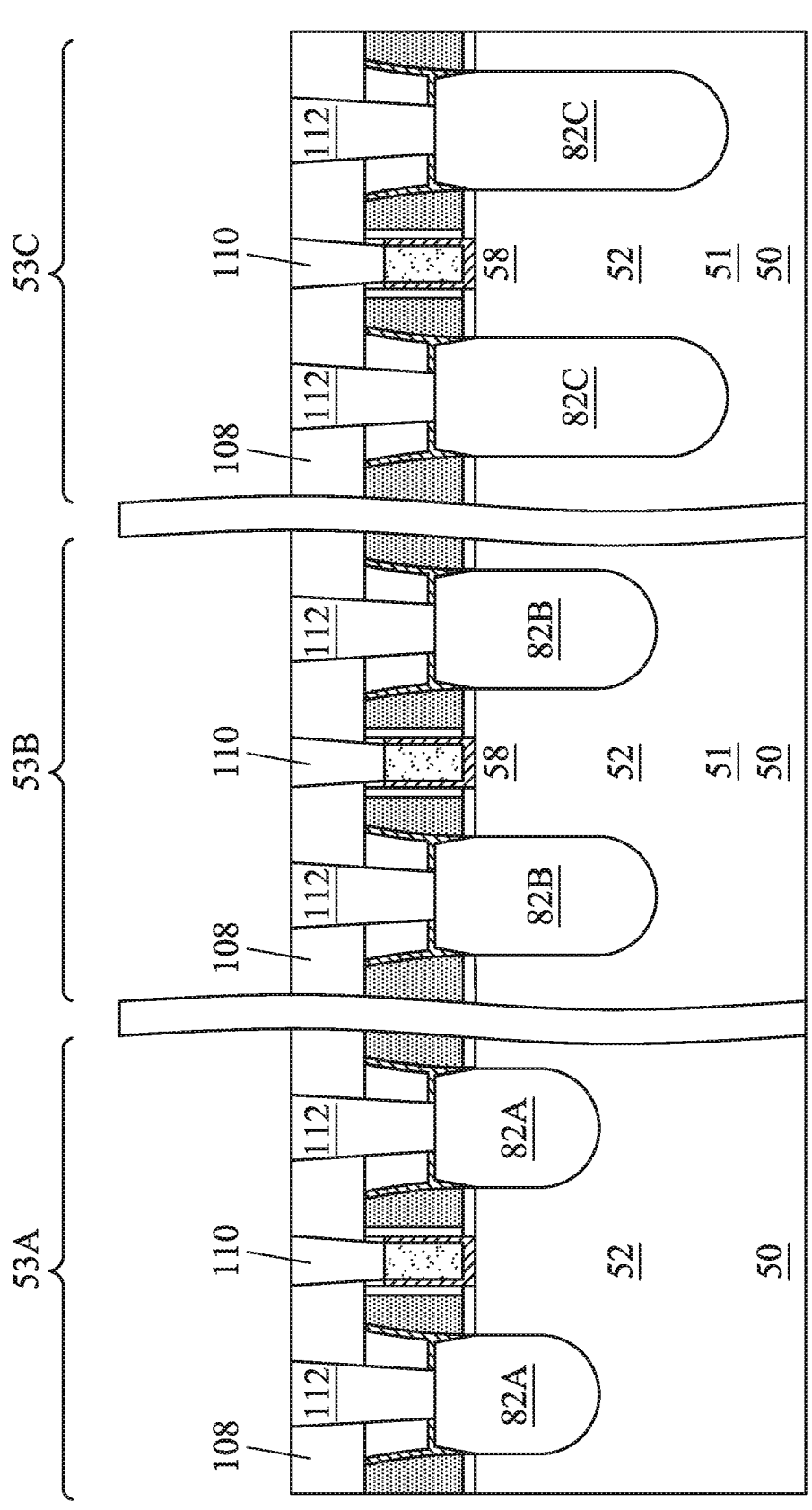

In FIGS. 23A and 23B, gate contacts 110 and source/drain contacts 112 are formed, in accordance with some embodiments. A gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

A second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 penetrate through the second ILD 108 and the gate mask 96 to contact the top surface of the recessed gate electrode 94.

Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

The embodiments disclosed here in may achieve advantages. Device regions of a substrate may be designated, in which each device region includes the devices or structures of similar types. For example, each device region may contain the devices that have a certain number of fins. By forming the source/drain recesses of different device regions with different depths, the epitaxial source/drain regions within each device region may be formed having a different size associated with that device region. In this manner, the size or depth of the epitaxial source/drain regions of a device region may be controlled to improve the performance of the types of device or structures within that device region. For example, a device region associated with devices having more fins may have larger epitaxial source/drain regions than a device region associated with devices having fewer fins. In some cases, a larger epitaxial source/drain region may allow for a larger operating current of a device. In this manner, the flexibility and optimization of the devices may be improved. For example, characteristics such as Ideff, DIBL, DC performance, AC performance, channel resistance, or the like may be optimized for the type of device or structure associated with each region.

In accordance with embodiments of the present disclosure, a method includes forming first devices in a first region of a substrate, wherein each first device has a first number of fins; forming second devices in a second region of the substrate that is different from the first region, wherein each second device has a second number of fins that is different from the first number of fins; forming first recesses in the fins of the first devices, wherein the first recesses have a first depth; after forming the first recesses, forming second recesses in the fins of the second devices, wherein the second recesses have a second depth different from the first depth; growing a first epitaxial source/drain region in the first recesses; and growing a second epitaxial source/drain region in the second recess. In an embodiment, the first number is less than the second number. In an embodiment, the first number is one. In an embodiment, each second device has four or more fins. In an embodiment, the second depth is greater than the first depth. In an embodiment, the second depth is between 5 nm and 20 nm greater than the first depth. In an embodiment, forming the first recesses includes performing a first etching process and forming the second recesses includes performing a second etching process that is different than the first etching process. In an embodiment, each second epitaxial source/drain region is larger than each first epitaxial source/drain region.

In accordance with embodiments of the present disclosure, a method includes forming a first raised portion of a substrate and a second raised portion of the substrate separated from the first raised portion; forming first fins on the first raised portion of the substrate and second fins on the second raised portion of the substrate, wherein the number of second fins formed on the second raised portion is greater than the number of first fins formed on the first raised portion; forming an isolation region surrounding the first fins and the second fins; forming a first gate structure over the first fins and a second gate structure over the second fins; performing a first etching process to form first recesses in the first fins adjacent the first gate structure, the first recesses having a first depth; performing a second etching process to form second recesses in the second fins adjacent the second gate structure, the second recesses having a second depth that is greater than the first depth; and forming a first source/drain regions in the first recesses and second source/drain regions in the second recesses. In an embodiment, the method includes forming first gate spacers on sidewalls of the first fins and second gate spacers on sidewalls of the second fins. In an embodiment, the first gate spacers that are adjacent the sidewalls of the first raised portion extend a smaller height above the isolation region than the first gate spacers that are away from the sidewalls of the first raised portion. In an embodiment, the first gate spacers extend a greater height above the isolation region than the second gate spacers. In an embodiment, performing the first etching process reduces a height of the first gate spacers a first amount, and performing the second etching process reduces a height of the second gate spacers a second amount, and wherein the second amount is greater than the first amount. In an embodiment, the number of first fins formed on the first raised portion is two. In an embodiment, performing the first etching process includes forming a photoresist over the first fins and the second fins; patterning the photoresist to expose the first fins; and performing an anisotropic dry etch on the first fins; and wherein performing the second etching process comprises: forming a photoresist over the first fins and the second fins; patterning the photoresist to expose the second fins; and performing an anisotropic dry etch on the second fins.

In accordance with embodiments of the present disclosure, a structure includes a substrate; a first semiconductor device in the substrate including a fin protruding from the substrate; a gate stack extending over the fin; a recess in the fin adjacent the gate stack, wherein the recess in the fin has a first depth; and an epitaxial source/drain region in the recess; and a second semiconductor device in the substrate including two adjacent fins protruding from the substrate; a gate stack extending over the two adjacent fins; a recess in each of the two adjacent fins adjacent the gate stack, wherein the recess in each of the two adjacent fins has a second depth that is greater than the first depth; and an epitaxial source/drain region in each recess. In an embodiment, the structure includes a third semiconductor device in the substrate including three adjacent fins protruding from the substrate; a gate stack extending over the three adjacent fins; a recess in each of the three adjacent fins adjacent the gate stack, wherein the recess in each of the three adjacent fins has a third depth that is greater than the second depth; and an epitaxial source/drain region in each recess. In an embodiment, the third depth is between 7 nm and 27 nm greater than the first depth. In an embodiment, the second depth is between 5 nm and 20 nm greater than the first depth. In an embodiment, the first semiconductor device includes first spacers on the gate stack having a first height, and the second semiconductor device includes second spacers on the gate stack having a second height, wherein the second height is less than the first height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming first devices in a first region of a substrate, wherein each first device has a first number of fins;

forming second devices in a second region of the substrate that is different from the first region, wherein each second device has a second number of fins that is different from the first number of fins, wherein the fins of the first devices are separated from the fins of the second devices;

forming first spacers on the fins of the first devices and second spacers on the fins of the second devices, wherein the first spacers extend farther from the substrate than the second spacers;

after forming the first spacers and the second spacers, forming first recesses in the fins of the first devices, wherein the first recesses have a first depth;

after forming the first recesses, forming second recesses in the fins of the second devices, wherein the second recesses have a second depth different from the first depth;

growing a first epitaxial source/drain region in the first recesses; and growing a second epitaxial source/drain region in the second recesses, wherein the first epitaxial source/drain region and the second epitaxial source/drain region have a same doping type.

2. The method of claim 1, wherein the first number is less than the second number.

3. The method of claim 2, wherein the first number is one.

4. The method of claim 1, wherein each second device has four or more fins.

5. The method of claim 1, wherein the second depth is greater than the first depth.

6. The method of claim 5, wherein the second depth is between 5 nm and 20 nm greater than the first depth.

7. The method of claim 1, wherein forming the first recesses comprises performing a first etching process and forming the second recesses comprises performing a second etching process that is different than the first etching process.

8. The method of claim 1, wherein the second epitaxial source/drain region is larger than the first epitaxial source/drain region.

9. The method of claim 1, wherein forming the second recesses reduces a height of the second spacers.

10. A method comprising:

forming a first semiconductor device in a substrate, the forming of the first semiconductor device comprising:

forming a fin protruding from the substrate;

forming a first gate stack extending over the fin;

forming a first recess in the fin adjacent the first gate stack, wherein the first recess in the fin has a first depth; and forming a first epitaxial source/drain region in the first recess;

forming a second semiconductor device in the substrate, the forming of the second semiconductor device comprising:

forming two adjacent fins protruding from the substrate;

forming a second gate stack extending over the two adjacent fins;

forming a second recess in each of the two adjacent fins adjacent the second gate stack, wherein the second recess in each of the two adjacent fins has a second depth that is greater than the first depth; and forming a second epitaxial source/drain region in each second recess; and forming a third semiconductor device in the substrate comprising:

forming three adjacent fins protruding from the substrate;

forming a third gate stack extending over the three adjacent fins;

forming a third recess in each of the three adjacent fins adjacent the third gate stack, wherein the third recess in each of the three adjacent fins has a third depth that is greater than the second depth; and forming a third epitaxial source/drain region in each third recess.

11. The method of claim 10, wherein the third depth is between 7 nm and 27 nm greater than the first depth.

12. The method of claim 10, wherein the second depth is between 5 nm and 20 nm greater than the first depth.

13. The method of claim 10, wherein the first semiconductor device comprises first spacers on the first gate stack, and the second semiconductor device comprises second spacers on the second gate stack, wherein the first spacers have a first height above the substrate that is greater than a second height above the substrate of the second spacers.

14. A method comprising:

forming a first device in a first region of a substrate, wherein the first device has a first number of fins;

forming a second device in a second region of the substrate that is different from the first region, wherein the second device has a second number of fins, wherein the second number is different from the first number, wherein the fins of the first device are separated from the fins of the second device, wherein the fins of the first device and the fins of the second device have a same pitch;

forming first spacers on the fins of the first device and forming second spacers on the fins of the second device, wherein the first spacers extend farther from the substrate than the second spacers;

after forming the first spacers and the second spacers, forming first recesses in the fins of the first device, wherein the first recesses are formed to have a first depth;

after forming the first recesses, forming second recesses in the fins of the second device, wherein the second recesses are formed to have a second depth different from the first depth;

growing a first epitaxial source/drain region in the first recesses; and growing a second epitaxial source/drain region in the second recesses, wherein the first epitaxial source/drain region and the second epitaxial source/drain region have a same doping type.

15. The method of claim 14, wherein the second number is larger than the first number, and the second depth is greater than the first depth.

16. The method of claim 14, wherein the first recesses are formed by etching the fins of the first device using a first etching process, wherein the second recesses are formed by etching the fins of the second device using a second etching process that is different from the first etching process.

17. The method of claim 14, wherein the fins of the first device are formed on a first raised portion of the substrate, and the fins of the second device are formed on a second raised portion of the substrate, wherein the second raised portion is wider than the first raised portion.

18. The method of claim 17, further comprising forming isolation regions along the fins of the first device and along the fins of the second device, wherein the isolation regions comprise:

a first isolation region between the first raised portion and the second raised portion; and a second isolation region between the fins of the second device, wherein a lower surface of the second isolation region facing the substrate extends farther from the substrate than a lower surface of the first isolation region facing the substrate.

19. The method of claim 17, wherein at least one of the fins of the first device has a sidewall that is flush with a sidewall of the first raised portion, wherein at least one of the fins of the second device has a sidewall that is flush with a sidewall of the second raised portion.

20. The method of claim 14, wherein forming the first recesses reduces a height of the first spacers, wherein forming the second recesses reduces a height of the second spacers.

* * * * *